(12) United States Patent
Sekar et al.

(10) Patent No.: US 8,154,904 B2
(45) Date of Patent: Apr. 10, 2012

(54) PROGRAMMING REVERSIBLE RESISTANCE SWITCHING ELEMENTS

(75) Inventors: Deepak C. Sekar, Sunnyvale, CA (US); Klaus Schuegraf, San Jose, CA (US); Roy Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 437 days.

(21) Appl. No.: 12/488,159

(22) Filed: Jun. 19, 2009

(65) Prior Publication Data

US 2010/0321977 A1 Dec. 23, 2010

(51) Int. Cl.
*G11C 11/00* (2006.01)
*G11C 8/00* (2006.01)
(52) U.S. Cl. .................................. 365/148; 365/163
(58) Field of Classification Search .............. 365/148, 365/163, 230.03
See application file for complete search history.

(56) References Cited

U.S. PATENT DOCUMENTS

| | | | |
|---|---|---|---|
| 5,917,773 A | 6/1999 | Yeo | |
| 6,661,730 B1 | 12/2003 | Scheuerlein et al. | |
| 6,724,665 B2 | 4/2004 | Scheuerlein et al. | |
| 7,218,570 B2 | 5/2007 | So et al. | |
| 7,907,441 B2 * | 3/2011 | Moon et al. | 365/163 |
| 2002/0136045 A1 | 9/2002 | Scheuerlein | |
| 2002/0136047 A1 | 9/2002 | Scheuerlein | |
| 2003/0043643 A1 | 3/2003 | Scheuerlein et al. | |
| 2004/0066671 A1 | 4/2004 | Scheuerlein et al. | |
| 2004/0264234 A1 | 12/2004 | Moore et al. | |
| 2006/0077741 A1 | 4/2006 | Wang et al. | |
| 2006/0126380 A1 | 6/2006 | Osada et al. | |
| 2007/0058425 A1 * | 3/2007 | Cho et al. | 365/163 |
| 2008/0112208 A1 * | 5/2008 | Cho et al. | 365/148 |
| 2008/0123389 A1 | 5/2008 | Cho et al. | |
| 2010/0293350 A1 * | 11/2010 | Happ et al. | 711/162 |

FOREIGN PATENT DOCUMENTS

| | | |
|---|---|---|
| WO | 2006/051779 A1 | 5/2006 |
| WO | 2009/011221 A1 | 1/2009 |

OTHER PUBLICATIONS

Partial International Search Report dated Aug. 23, 2010 in PCT Application No. PCT/US2010/037841, filed on Jun. 8, 2010.
International Search Report & The Written Opinion of the International Searching Authority dated Feb. 28, 2011, Patent Cooperation Treaty, PCT Application No. PCT/US2010/037841, filed Jun. 8, 2010.
English Abstract of Foreign Patent Document WO 2006/051779, Published May 18, 2006, Applicant: Matsushita Electric Ind Co Ltd [JP].
European Office Action dated Feb. 1, 2012, European Patent Application No. 10726382.4 filed Jun. 8, 2010, 13 pages.

* cited by examiner

*Primary Examiner* — Anh Phung
(74) *Attorney, Agent, or Firm* — Vierra Magen Marcus & DeNiro LLP

(57) ABSTRACT

A storage system and method for operating the storage system that uses reversible resistance-switching elements is described. Techniques are disclosed herein for varying programming conditions to account for different resistances that memory cells have. These techniques can program memory cells in fewer attempts, which can save time and/or power. Techniques are disclosed herein for achieving a high programming bandwidth while reducing the worst case current and/or power consumption. In one embodiment, a page mapping scheme is provided that programs multiple memory cells in parallel in a way that reduces the worst case current and/or power consumption.

14 Claims, 11 Drawing Sheets

PROGRAMMING REVERSIBLE RESISTANCE SWITCHING ELEMENTS

BACKGROUND

1. Field

The present invention relates to technology for data storage.

2. Description of the Related Art

A variety of materials show reversible resistance-switching behavior. These materials include chalcogenides, carbon polymers, perovskites, and certain metal oxides and nitrides. Specifically, there are metal oxides and nitrides which include only one metal and exhibit reliable resistance switching behavior. This group includes, for example, NiO, $Nb_2O_5$, $TiO_2$, $HfO_2$, $Al_2O_3$, $MgO_x$, $CrO_2$, VO, BN, and AlN, as described by Pagnia and Sotnick in "Bistable Switching in Electroformed Metal-Insulator-Metal Device," Phys. Stat. Sol. (A) 108, 11-65 (1988). A layer of one of these materials may be formed in an initial state, for example a relatively low-resistance state. Upon application of sufficient voltage, the material switches to a stable high-resistance state. This resistance switching is reversible such that subsequent application of an appropriate current or voltage can serve to return the resistance-switching material to a stable low-resistance state. This conversion can be repeated many times. For some materials, the initial state is high-resistance rather than low-resistance.

These reversible resistance-switching materials are of interest for use in nonvolatile memory arrays. One resistance state may correspond to a data "0," for example, while the other resistance state corresponds to a data "1." Some of these materials may have more than two stable resistance states.

Non-volatile memories formed from reversible resistance-switching elements are known. For example, U.S. Patent Application Publication 2006/0250836, filed May 9, 2005 and titled "REWRITEABLE MEMORY CELL COMPRISING A DIODE AND A RESISTANCE-SWITCHING MATERIAL," which is hereby incorporated by reference herein in its entirety, describes a rewriteable non-volatile memory cell that includes a diode coupled in series with a reversible resistance-switching material such as a metal oxide or metal nitride. Such memory cells can be programmed by applying one or more programming signals to cause the reversible resistance-switching to change from a low resistance state to a high resistance state, which may be referred to as RESETTING. Similarly, the memory cells can be programmed by applying one or more programming signals to cause the reversible resistance-switching to change from the high resistance state to the low resistance state, which may be referred to as SETTING.

However, operating memory devices that employ reversible resistance-switching materials is difficult. Specifically, programming the memory cells can be challenging. It may be desirable to RESET (or SET) the memory cell using relatively few programming signals to save time and/or power. However, the conditions needed to RESET (or SET) can vary from one memory cell to the next. Therefore, it can be difficult to efficiently program all of the memory cells using the same programming conditions.

Also, it is desirable to program a large number of memory cells in a short amount of time. In other words, a high programming bandwidth is desirable. However, it can be difficult to achieve a high programming bandwidth while staying within a maximum current and/or power consumption of the memory device.

SUMMARY

A storage system and method for operating the storage system that uses reversible resistance-switching elements is described. Techniques are disclosed herein for varying programming conditions to account for different resistances that memory cells have. These techniques can program memory cells in fewer attempts, which can save time and/or power. Techniques are disclosed herein for achieving a high programming bandwidth while reducing the worst case current and/or power consumption. In one embodiment, a page mapping scheme is used to program multiple memory cells in parallel in a way that reduces the worst case current and/or power consumption.

One embodiment is a method of operating non-volatile storage that includes the following. Information that is indicative of an impedance characteristic of a reversible resistance-switching element is determined. A programming voltage for the reversible resistance-switching element is determined based at least in part on the impedance characteristic. The reversible resistance-switching element is programmed using the programming voltage.

One embodiment is an apparatus comprising a reversible resistance-switching element and one or more management circuits in communication with the reversible resistance-switching element. The one or more management circuits determine information indicative of an impedance characteristic of the reversible resistance-switching element. The one or more management circuits determine a programming voltage for the reversible resistance-switching element based at least in part on the impedance characteristic. The one or more management circuits program the reversible resistance-switching element using the programming voltage.

One embodiment is a method of operating non-volatile storage that includes groups of reversible resistance-switching elements. The current and/or power used by a group when programming a selected reversible resistance-switching element in the group is a function of the location of the selected reversible resistance-switching element in its group. The method comprises the following. A unit of data to be stored in the non-volatile storage is received. The unit of data is mapped to reversible resistance-switching elements in different groups based on the location of the reversible resistance-switching elements in order to minimize the worst case current and/or power consumption when programming the unit of data in parallel into reversible resistance-switching elements in different groups. Reversible resistance-switching elements in different groups are programmed in parallel based on the mapping.

One embodiment is a non-volatile storage device that has a number of blocks each having reversible resistance-switching elements. Each block includes word lines, word line drivers, bit lines, and bit line drivers. Each reversible resistance-switching element is coupled to one of the word lines and one of the bit lines. Further, each reversible resistance-switching element is associated with one of the bit line drivers and one of the word line drivers. The non-volatile storage device has one or more management circuits in communication with the reversible resistance-switching elements. The one or more management circuits concurrently program a first reversible resistance-switching element in a first of the blocks and a second reversible resistance-switching element in a second of the blocks. The first reversible resistance-switching element is farther from one or both of the bit line driver or the word line driver that is associated with the first reversible resistance-switching element than the second reversible resistance-switching element is from one or both of the bit line driver or the word line driver that is associated with the second reversible resistance-switching element.

DETAILED DESCRIPTION

A memory system is provided that includes memory cells that have a reversible resistivity-switching element. Various systems and methods are disclosed for varying the programming conditions to account for different resistances that reversible resistivity-switching elements have. For example, the resistance of the reversible resistivity-switching element in the memory cell being programmed may be used to determine a suitable programming voltage in order to reduce the number of times that programming the memory cell must be attempted before it RESETS (or SETS). Various systems and methods are disclosed herein for achieving a high programming bandwidth while reducing the worst case current and/or power consumption. For example, the power that is consumed by an entire group of memory cells (e.g., block) when programming a selected memory cell within the group may be a function of the location of the selected memory cell within the group. In one embodiment, a page mapping scheme is provided that is used to program multiple memory cells in parallel in a way that reduces the worst case current and/or power consumption for all of the groups. An example memory cell having a reversible resistance-switching element and system for programming such memory cells is described below. However, note that the systems and methods disclosed herein are not limited to the example memory cell and system described below.

Memory Cell and System

Figure 1:
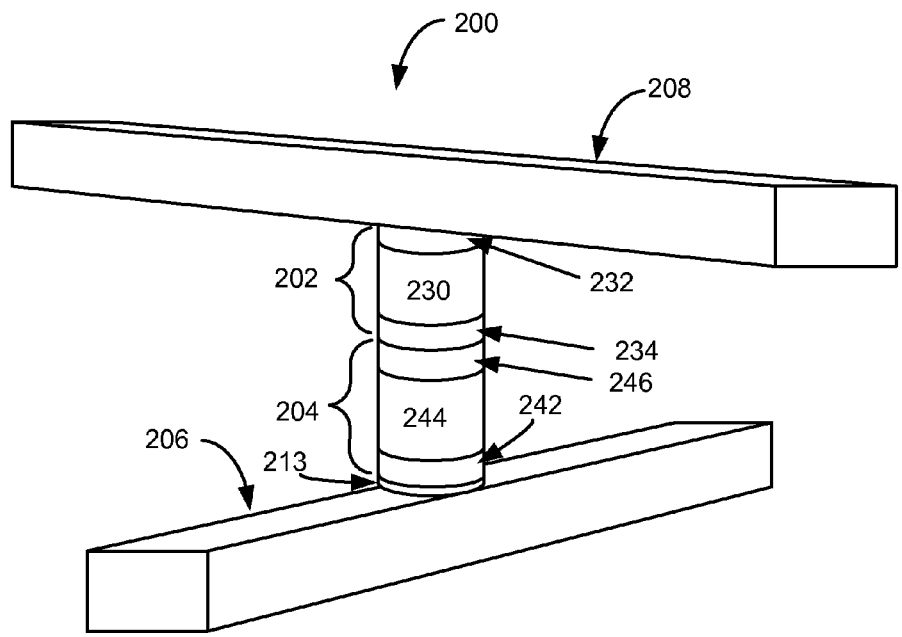
FIG. 1 is a simplified perspective view of one embodiment of a memory cell with a reversible resistance-switching element.

FIG. 1 is a simplified perspective view of one embodiment of a memory cell 200 which includes a reversible resistance-switching element 202 coupled in series with a steering element 204 between a first conductor 206 and a second conductor 208. Reversible resistance-switching element 202 includes reversible resistivity-switching material 230 having a resistivity that may be reversibly switched between two or more states. For example, the reversible resistivity-switching material may be in an initial high-resistivity state upon fabrication that is switchable to a low-resistivity state upon application of a first physical signal. For example, the device may switch states in response to application of a first amount of energy, charge, heat, voltage, current or other phenomena. Application of a second amount of energy, charge, heat, voltage, current or other phenomena may return the reversible resistivity-switching material to the high-resistance state. Alternatively, the reversible resistance-switching element may be in an initial low-resistance state upon fabrication that is reversibly switchable to a high-resistance state upon application of the appropriate energy, charge, heat, voltage, current or other phenomena. When used in a memory cell, one resistance state may represent a binary "0" while another resistance state may represent a binary "1." However, more than two data/resistance states may be used. Numerous reversible resistivity-switching materials and operation of memory cells employing reversible resistance-switching materials are described, for example, in U.S. Patent Application Publication 2006/0250836, previously incorporated.

In one embodiment, the process of switching the resistance from the high-resistivity state to the low-resistivity state is referred to as SETTING the reversible resistance-switching element 202. The process of switching the resistance from the low-resistivity state to the high-resistivity state is referred to as RESETTING the reversible resistance-switching element 202. The high-resistivity state may be associated with binary data "0" and the low-resistivity state is associated with binary data "1." In other embodiments, SETTING and RESETTING and/or the data encoding can be reversed.

In some embodiments, reversible resistance-switching material 230 may be formed from a metal oxide. Various different metal oxides can be used. In one example, nickel oxide is be used. More information about fabricating a memory cell using reversible resistance-switching material can be found in United States Patent Application Publication 2009/0001343, filed on Jun. 29, 2007, entitled "Memory Cell That Employs A Selectively Deposited Reversible Resistance Switching Element and Methods of Forming The Same," which is hereby incorporated herein by reference in its entirety.

Reversible resistance-switching element 202 includes electrodes 232 and 234. Electrode 232 is positioned between metal oxide reversible resistivity-switching material 230 and conductor 208. In one embodiment, electrode 232 is made of platinum. Electrode 234 is positioned between metal oxide reversible resistivity-switching material 230 and diode 204. In one embodiment, electrode 234 is made of Titanium Nitride, and serves as a barrier layer.

Steering element 204 can be a diode, or other suitable steering element that exhibits non-ohmic conduction by selectively limiting the voltage across and/or the current flow through the reversible resistance-switching element 202. In this manner, the memory cell 200 may be used as part of a two or three dimensional memory array and data may be written to and/or read from the memory cell 200 without affecting the state of other memory cells in the array. Diode 204 may include any suitable diode such as a vertical polycrystalline p-n or p-i-n diode, whether upward pointing with an n-region above a p-region of the diode or downward pointing with a p-region above an n-region of the diode.

In some embodiments, diode 204 may be formed from a polycrystalline semiconductor material such as polysilicon, a polycrystalline silicon-germanium alloy, polygermanium or any other suitable material. For example, the diode 204 may include a heavily doped n+ polysilicon region 242, a lightly doped or an intrinsic polysilicon region 244 above the n+ polysilicon region 242, and a heavily doped p+ polysilicon region 246 above the intrinsic region 244. In some embodiments, a thin (e.g., a few hundred angstroms or less) germanium and/or silicon-germanium alloy layer (not shown), with about 10% or more of germanium when using a silicon-germanium alloy layer, may be formed on the n+ polysilicon region 242 to prevent and/or reduce dopant migration from the n+ polysilicon region 242 into the intrinsic region 244, as described, for example, in U.S. Patent Application Publication No. 2006/0087005, filed Dec. 9, 2005 and titled "DEPOSITED SEMICONDUCTOR STRUCTURE TO MINIMIZE N-TYPE DOPANT DIFFUSION AND METHOD OF MAKING," which is hereby incorporated by reference herein in its entirety. It will be understood that the locations of the n+ and p+ regions may be reversed.

When diode 204 is fabricated from deposited silicon (e.g., amorphous or polycrystalline), a silicide layer may be formed on the diode to place the deposited silicon in a low resistivity state, as fabricated. Such a low resistivity state allows for easier programming of the memory cell as a large voltage is not required to switch the deposited silicon to a low resistivity state.

Conductors 206 and 208 may include any suitable conductive material such as tungsten, any appropriate metal, heavily doped semiconductor material, a conductive silicide, a conductive silicide-germanide, a conductive germanide, or the like. In the embodiment of FIG. 1, conductors 206 and 208 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 206 and 208 to improve device performance and/or aid in device fabrication.

While the reversible resistance-switching element 202 is shown as being positioned above the steering element 204 in FIG. 1, it will be understood that in alternative embodiments, the reversible resistance-switching element 202 may be positioned below the steering element 204.

Figure 2:
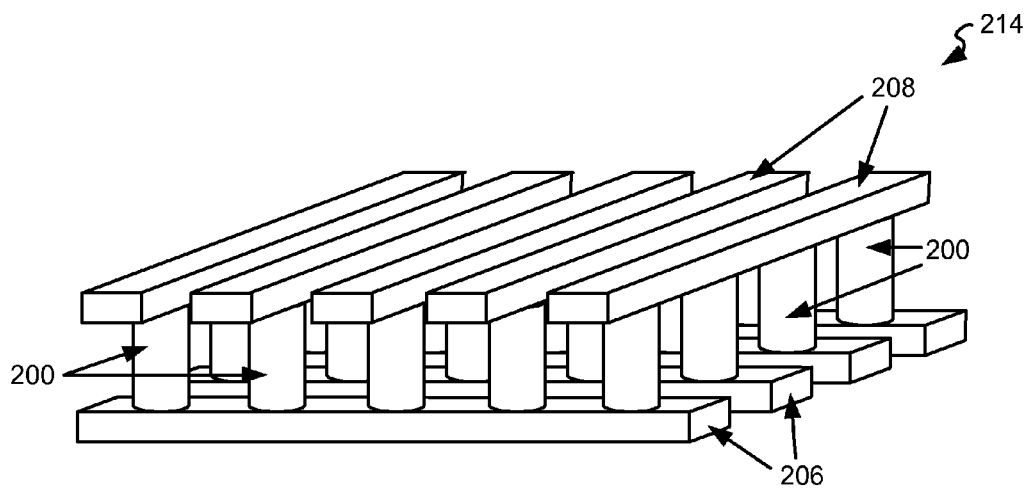
FIG. 2 is a simplified perspective view of a portion of a first memory level formed from a plurality of the memory cells of FIG. 1.

FIG. 2 is a simplified perspective view of a portion of a first memory level 214 formed from a plurality of the memory cells 200 of FIG. 1. For simplicity, the reversible resistance-switching element 202, the diode 204, and barrier layer 213 are not separately shown. The memory array 214 is a "cross-point" array including a plurality of bit lines (second conductors 208) and word lines (first conductors 206) to which multiple memory cells are coupled (as shown). Other memory array configurations may be used, as may multiple levels of memory.

Figure 3:
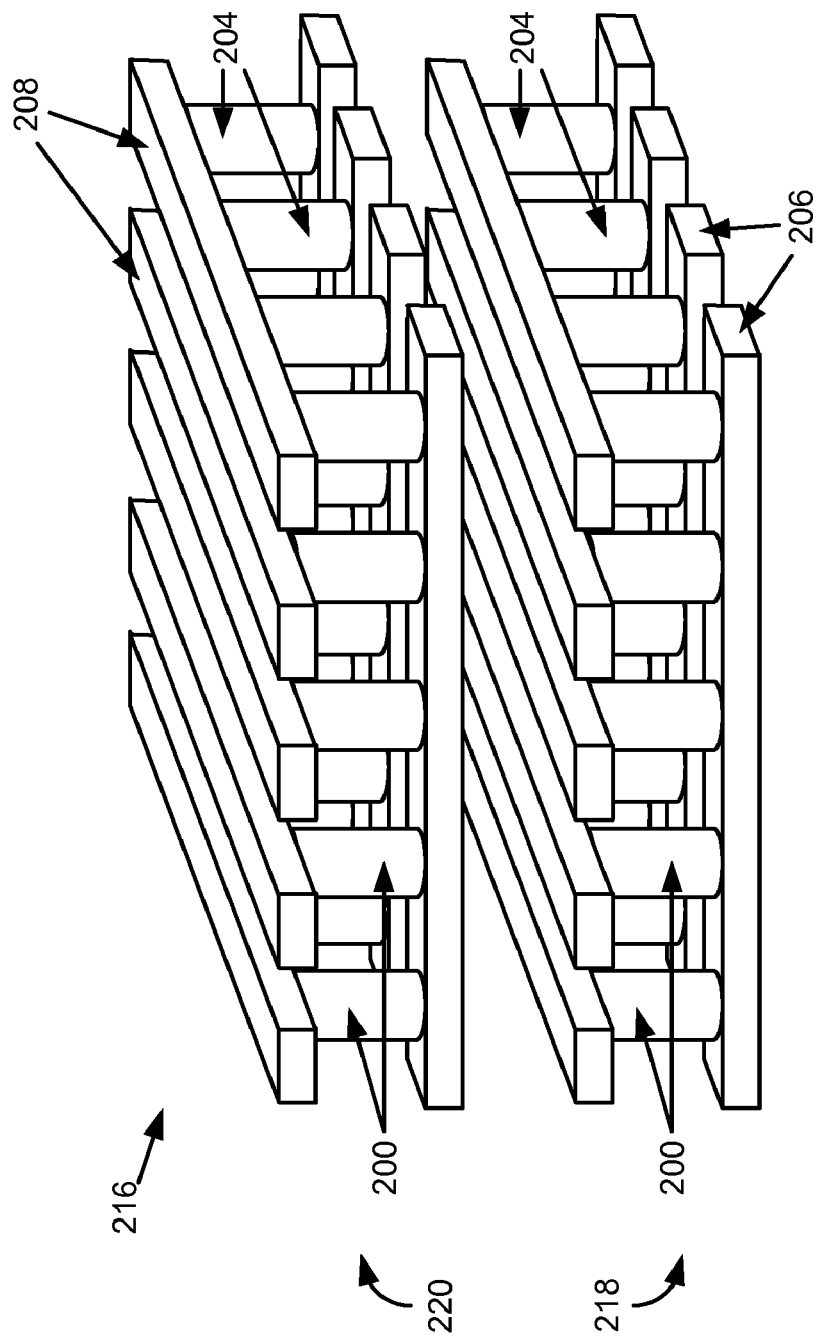
FIG. 3 is a simplified perspective view of a portion of a three dimensional memory array.

FIG. 3 is a simplified perspective view of a portion of a monolithic three dimensional array 216 that includes a first memory level 218 positioned below a second memory level 220. In the embodiment of FIG. 3, each memory level 218 and 220 includes a plurality of memory cells 200 in a cross-point array. It will be understood that additional layers (e.g., an inter-level dielectric) may be present between the first and second memory levels 218 and 220, but are not shown in FIG. 3 for simplicity. Other memory array configurations may be used, as may additional levels of memory. In the embodiment of FIG. 3, all diodes may "point" in the same direction, such as upward or downward depending on whether p-i-n diodes having a p-doped region on the bottom or top of the diode are employed, simplifying diode fabrication.

Figure 4:
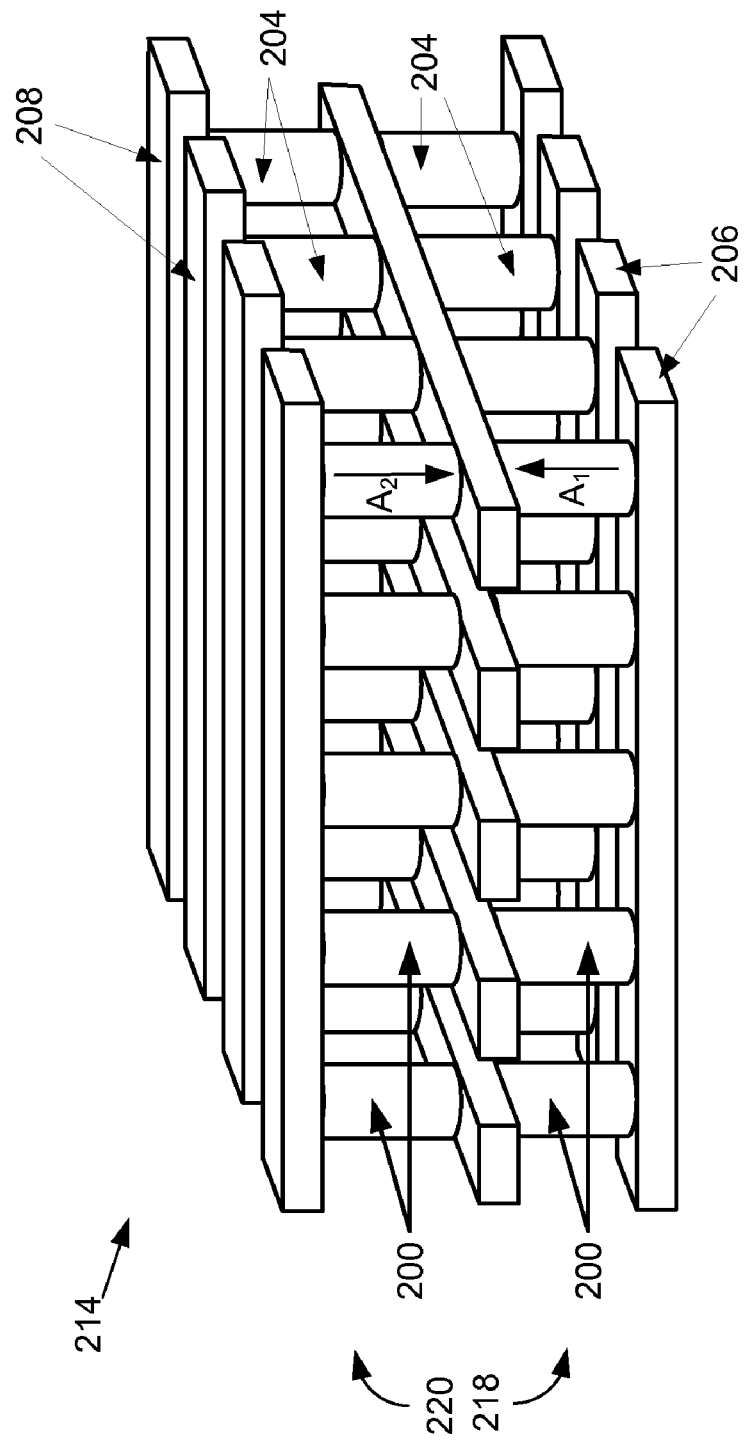
FIG. 4 is a simplified perspective view of a portion of a three dimensional memory array.

In some embodiments, the memory levels may be formed as described in U.S. Pat. No. 6,952,030, "High-Density Three-Dimensional Memory Cell," which is hereby incorporated by reference herein in its entirety. For instance, the upper conductors of a first memory level may be used as the lower conductors of a second memory level that is positioned above the first memory level as shown in FIG. 4. In such embodiments, the diodes on adjacent memory levels preferably point in opposite directions, as described in U.S. patent application Ser. No. 11/692,151, filed Mar. 27, 2007 and titled "Large Array Of Upward Pointing P-I-N Diodes Having Large And Uniform Current," which is hereby incorporated by reference herein in its entirety. For example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

FIGS. 1-4 show memory cells in a cylindrical shape and conductors in the shapes of rails according to the disclosed arrangements. However, the technology described herein is not limited to any one specific structure for a memory cell. Other structures can also be used to form memory cells that include reversible resistivity-switching material. For example, the following patents provide examples of structures of memory cells that can be adapted to use reversible resistivity-switching material: U.S. Pat. No. 6,952,043; U.S. Pat. No. 6,951,780; U.S. Pat. No. 6,034,882; U.S. Pat. No. 6,420,215; U.S. Pat. No. 6,525,953; and U.S. Pat. No. 7,081,377.

Figure 5A:
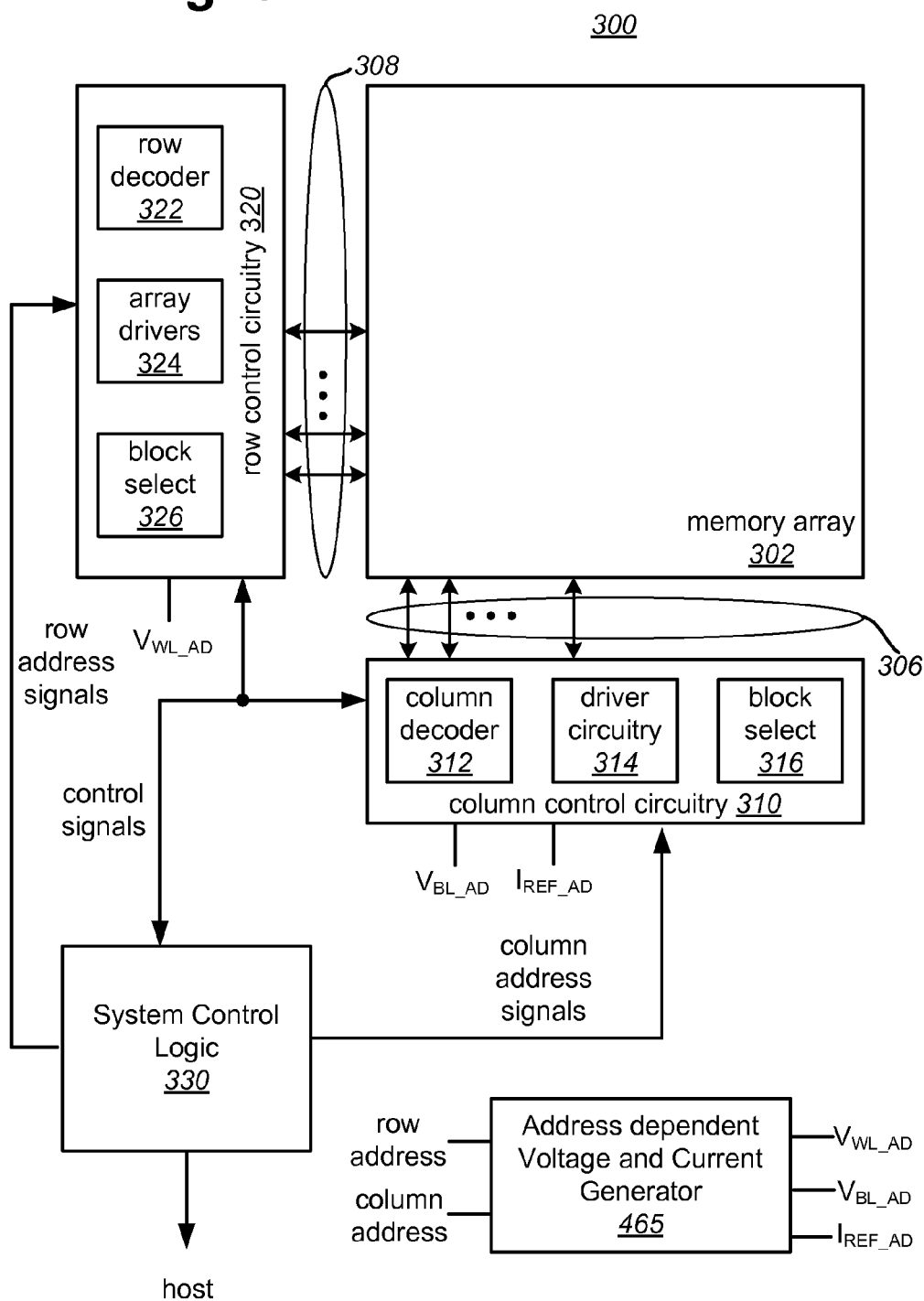
FIG. 5A is a block diagram of one embodiment of a memory system.

FIG. 5A is a block diagram that depicts one example of a memory system 300 that can implement the technology described herein. Memory system 300 includes a memory array 302 that can be a two or three dimensional array of memory cells as described above. In one embodiment, memory array 302 is a monolithic three dimensional memory array. The array terminal lines of memory array 302 include the various layer(s) of word lines organized as rows, and the various layer(s) of bit lines organized as columns. However, other orientations can also be implemented.

Memory system 300 includes row control circuitry 320, whose outputs 308 are connected to respective word lines of the memory array 302. Row control circuitry 320 receives a group of M row address signals and one or more various control signals from System Control Logic circuit 330, and typically may include such circuits as row decoders 322, array terminal drivers 324, and block select circuitry 326 for both read and programming (e.g., SET and RESET) operations. Memory system 300 also includes column control circuitry 310 whose input/outputs 306 are connected to respective bit lines of the memory array 302. Column control circuitry 306 receives a group of N column address signals and one or more various control signals from System Control Logic 330, and typically may include such circuits as column decoders 312, array terminal receivers or drivers 314, block select circuitry 316, as well as read/write circuitry, and I/O multiplexers. System control logic 330 receives data and commands from a host and provides output data to the host. In other embodiments, system control logic 330 receives data and commands from a separate controller circuit and provides output data to that controller circuit, with the controller circuit communicating with the host. System control logic 330 may include one or more state machines, registers and other control logic for controlling the operation of memory system 300.

Integrated circuits incorporating a memory array usually subdivide the array into a number of sub-arrays or blocks. Blocks can be further grouped together into bays that contain, for example, 16, 32, or a different number of blocks. Each block in a 3-D memory may have many layers of memory cells. For example, a block might include 8 layers. Each layer may include hundreds, or thousands of bit lines and word lines. For example, a layer might have about a thousand bit lines and about 8 thousand word lines. In some implementations, there is a bit line driver associated with each bit line. Note that a given driver could be shared between two or more bit lines. Also note that it is not required that a given bit line have only one driver associated therewith. In some implementations, some of the drivers are physically located on one end of the bit lines and other drivers on the other end of the bit lines.

As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

Figure 5B:
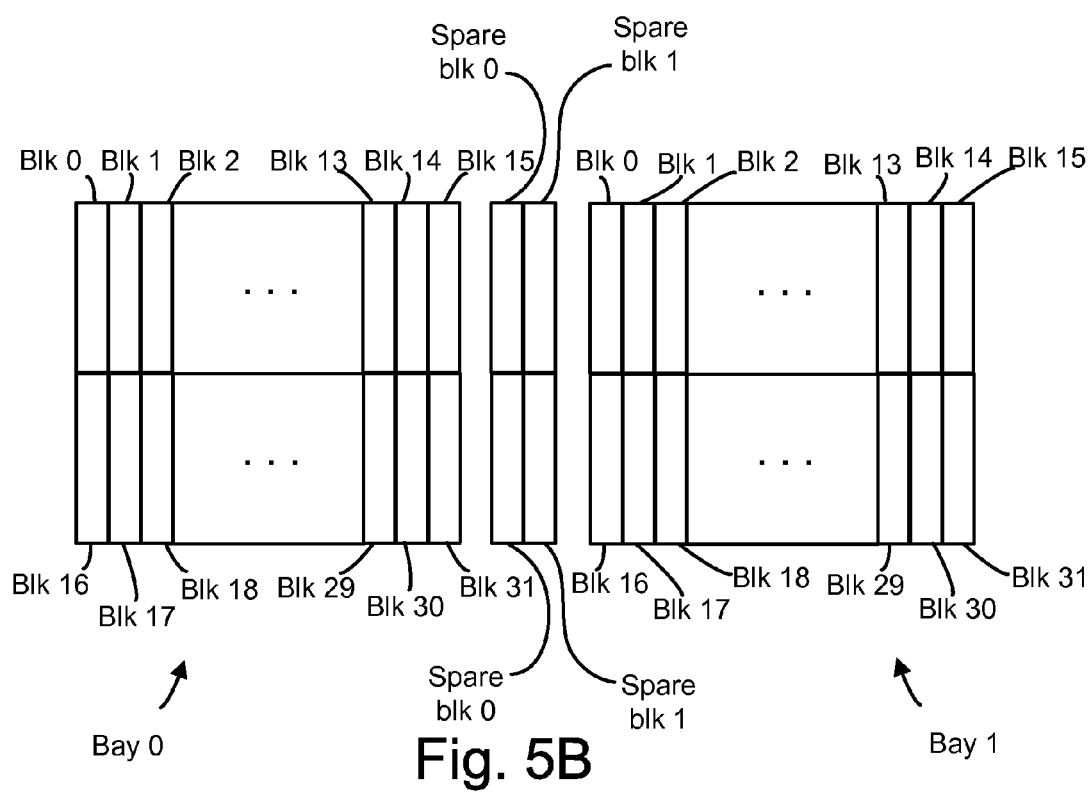
FIG. 5B depicts a schematic of one embodiment of bays.

As mentioned above, the storage elements in a memory device can be organized in different sets or units. In one possible approach, the storage elements are organized into a number of bays, such as 4, 8, 16, 32 or 64 bays, where each bay includes, e.g., 32 blocks, 64 blocks, or some other number of blocks. FIG. 5B depicts an organization of a set of two bays of storage elements. In this example, each bay has 32 blocks for storing user data and two spare blocks.

In some implementations, when writing the memory array more than one bay is programmed at the same time, which may serve to increase the programming bandwidth. For example, one or more memory cells in block 0 in two different bays might be programmed in parallel. As previously mentioned, it may be difficult to concurrently program too many memory cells in a given block. Programming memory cells concurrently in different bays can therefore increase programming bandwidth. However, as will be further discussed below, there are still challenges with selecting appropriate memory cells in each bay in order to achieve a high programming bandwidth in view the worst case power (or current) consumption. Stated briefly, even if there are not too may memory cells being concurrently programmed in a single bay, the total power (or current) consumed while concurrently programming all of the memory cells in all of the bays should be kept below a maximum current (or power) consumption.

When writing to the memory array, a page of data may be divided into different portions, with the different portions being written to different bays. For example, each page may include 2056 bytes. As an example, the page could be divided into four portions, each of which is written to a different bay. In some implementations, the page is written to the same numbered block in each bay. For example, a portion of the page might be written to block 0 in each of several different bays. In some implementations, the page is divided into however many bays there are. For example, if there are 32 bays, then the page is divided into 32 pieces (which may be of equal size). Each piece is then written to the same numbered block in the different bays. Note that it is not required that all of the data is programmed concurrently. For example, as few as one bit in each bay can be programmed concurrently. In some implementations, multiple bits are concurrently written to each bay. Also, note that it is not an absolute requirement that the same numbered block be written concurrently in each bay.

Embodiments reduce the worst case current and/or power consumption by a page mapping scheme that is used when concurrently programming memory cells. Note that the current and/or power that is used by a group of memory cells (e.g., block) when programming a particular memory cell may be a function of the location of the memory cell within the group. For example, when programming a memory cell that is far from its bit line driver and/or word line driver, the total current/power consumed may be higher than when programming a memory cell that is close to one or both of its drivers. A reason for this additional power/current consumption is the reverse bias current of diodes associated with unselected memory cells, which will be discussed below. One embodiment is a page mapping scheme that maps the page to memory cells in different blocks (the blocks may be in different bays). For the sake of illustration, the current/power used by a first block when programming a first memory cell in the first block may be relatively high. In order to reduce the worst case current/power consumption, a memory cell is selected for programming in a second block such that the current/power used by the second block when programming a second memory cell in the second block is relatively low. In other words, the page mapping scheme avoids parallel programming of memory cells in different blocks where each block consumes a relatively high amount of current/power. Thus, the page mapping scheme reduces the worst case current/power consumption. By reducing the worst case current/power consumption a greater number of bits can be programmed in parallel. Hence, the programming bandwidth can be increased while staying within a worst case current and/or power consumption of the memory device.

In some embodiments, the bit line and word line voltages that are used during programming are a function of the address of the memory cell being programmed. For example, the voltage of the selected bit line and the voltage of the unselected word lines may be a function of the address of the memory cell being programmed. However, another scheme might be used. Referring again to FIG. 5A, the address dependent voltage and current generator 465 generates bit line voltages ($V_{BL\_AD}$) and word line voltages ($V_{WL\_AD}$) that are based on the memory cell address. The system control logic 330 provides row address and column address information to generator 465. The generator 465 provides the bit line and word line voltages to the row control circuitry 310 and column control circuitry 320, respectively. A reason for applying these voltages during programming relates to the fact that the address of a memory cell may correlate with the distance that the memory cell is from its bit line driver and its word lines driver. The address dependent voltages (and reference current) may compensate for different voltage drops along the bit lines and word lines due to different lengths between a memory cell and its drivers. Further details are discussed below.

In some embodiments, different programming voltages may be concurrently applied to selected bit lines in different bays. For example, when programming memory cells in order to reduce the worst case power consumption, a lower voltage may be applied to a selected bit line in one bay than a selected bit line in another bay. Furthermore, different voltages may be concurrently applied to unselected word lines in different bays. Therefore, there may be more than one address dependent voltage and current generator 465 in order to provide the different bit line voltages and different word line voltages.

In some embodiments, a reference current that is used when reading memory cells is a function of the address of the memory cell being read. The address dependent voltage and current generator 465 generates address dependent current $I_{REF\_AD}$, which is provided to the column control circuitry 310 to use when reading memory cells.

In one embodiment, all of the components depicted in FIG. 5A are arranged on a single integrated circuit. For example, system control logic 330, column control circuitry 310, and row control circuitry 320 are formed on the surface of a substrate and memory array 302 is a monolithic three dimensional memory array formed above the substrate (and, therefore, above system control logic 330, column control circuitry 310 and row control circuitry 320). In some cases, a portion of the control circuitry can be formed on the same layers as some of the memory array 302.

As described above, reversible resistance-switching element 202 may be reversibly switched between two or more states. For example, the reversible resistivity-switching material may be in an initial, high-resistivity state upon fabrication that is switchable to a low-resistivity state upon application of a first amount of energy, charge, heat, voltage and/or current. Application of a second amount of energy, charge, heat, voltage and/or current may return the reversible resistivity-switching material to a high-resistivity state.

Figure 6:
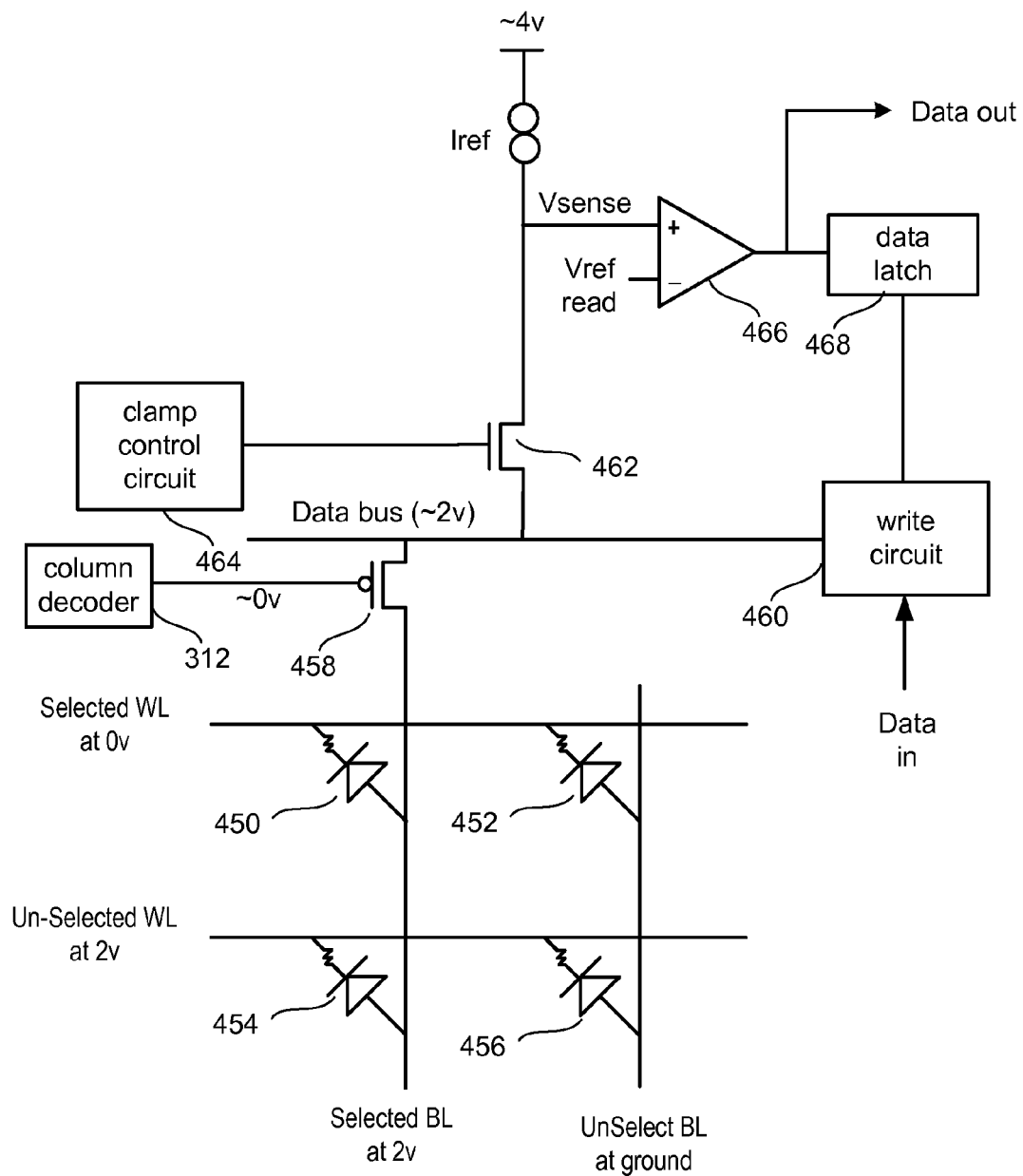
FIG. 6 depicts a circuit that can read the state of a memory cell.

FIG. 6 depicts a circuit that illustrates one embodiment for reading the state of a memory cell. FIG. 6 shows a portion of a memory array including memory cells 450, 452, 454 and 456, which may be based on the embodiments of FIGS. 1-4. Two of the many bit lines and two of the many word lines are depicted. A read circuit for one of the bit lines is depicted to be connected to the bit line via transistor 458, which is controlled by a gate voltage supplied by column decoder 312 in order to select or unselect the corresponding bit line. Transistor 458 connects the bit line to a Data bus. Write circuit 460 (which is part of system control logic 330) is connected to the Data bus. Transistor 462 connects to the Data bus and operates as a clamp device that is controlled by clamp control circuit 464 (which is part of system control logic 330). Transistor 462 is also connected to comparator 466 and reference current supply $I_{REF}$. The output of comparator 466 is connected to a data out terminal (to system control logic 330, a controller and/or a host) and to data latch 468. Write circuit 460 is also connected to data latch 468.

When attempting to read the state of the reversible resistance-switching element, all word lines are first biased at Vread (e.g., approximately 2 volts) and all bit lines are at ground. The selected word line is then pulled to ground. For example purposes, this discussion will assume that memory cell 450 is selected for reading. One or more selected bit lines are pulled to Vread through the data bus (by turning on transistor 458) and the clamp device (transistor 462, which receives ~2 volts+Vt). The clamp device's gate is above Vread but controlled to keep the bit line near Vread. Current is pulled by the selected memory cell through transistor 462 from the $V_{SENSE}$ node. The $V_{SENSE}$ node also receives a reference current $I_{REF}$ that is between a high-resistivity state current and a low-resistivity state current. The $V_{SENSE}$ node moves corresponding to the current difference between the cell current and the reference current $I_{REF}$. Comparator 466 generates a data out signal by comparing the $V_{SENSE}$ voltage to a Vref-read voltage. If the memory cell current is larger than $I_{REF}$, the memory cell is in the low-resistivity state and the voltage at $V_{SENSE}$ will be lower than $V_{REF}$. If the memory cell current is smaller than $I_{REF}$, the memory cell is in the high-resistivity state and the voltage at $V_{SENSE}$ will be higher than $V_{REF}$. The data out signal from comparator 466 is latched in data latch 468. In some embodiments, the reference current is based on the address of the memory cell.

Note that the circuit of FIG. 6 is not limited to determining which state the memory cell is in. By appropriate selection of $I_{REF}$, the memory cell's resistance can be compared to any arbitrary resistance. Some embodiments herein use the circuit of FIG. 6 to determine whether the resistance of a memory cell is above or below a resistance in order to determine an impedance characteristic that is used to determine a program voltage.

Figure 7:
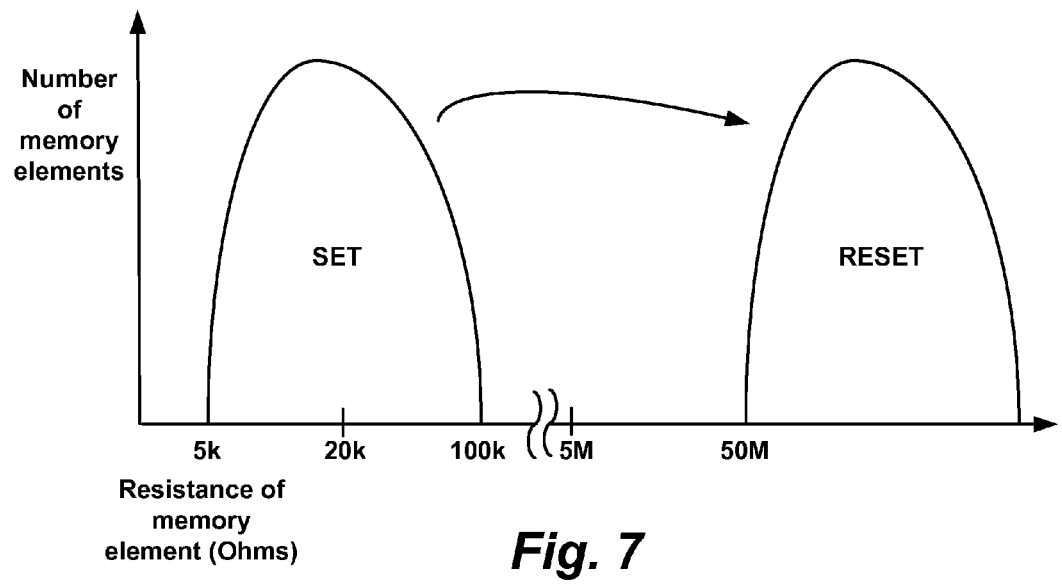
FIG. 7 depicts example SET and RESET resistance distributions of memory cells.

As previously discussed, memory cells may be programmed to a low resistance "SET" state or a high resistance "RESET" state. FIG. 7 depicts two example resistance distributions of the reversible resistance-switching elements of memory cells. The range of resistances for SET memory cells is between about 5 kOhm and 100 kOhm in this example. The lowest resistance for a reversible resistance-switching element in the RESET state may be many times more than 100 kOhm. As an example, the lowest resistance for the RESET state may be 50 MOhm. Note that the range of resistances may vary significantly depending on the materials and construction of the memory cells. Also note that while only two different states are depicted in FIG. 7, it may be possible to program reversible resistance-switching elements to more than two states. That is, additional resistance ranges might be used to represent other states.

When "reading" a memory cell, it is not required to determine the exact resistance of the reversible resistance-switching element. Since there may be a large gap in resistance between the SET and RESET state, when reading using the circuit of FIG. 6, the value of $I_{REF}$ may be selected to determine whether a reversible resistance-switching element has a resistance that is either above or below a selected resistance somewhere between 100 kOhm and 50 MOhm. Note that using the exact same value for $I_{REF}$ for all memory cells will not necessarily determine whether the reversible resistance-switching element resistance is above/below the exact same resistance. For example, for a memory cell at one location in the block, $I_{CELL} > I_{REF}$ may imply that the resistance is less than 5 MOhm. However, for a memory cell at another location in the block, $I_{CELL} > I_{REF}$ may imply that the resistance is less than 5.1 MOhm. Note that in some embodiments, $I_{REF}$ is a function of memory cell location (e.g., address) to allow for a more accurate determination of the reversible resistance-switching element resistance.

Programming a SET memory cell to the RESET state involves raising its resistance to at least a target resistance. For example, referring to FIG. 7, the target RESET resistance for the memory cell may be at least 50 MOhm. One or more programming signals are applied to circuitry connected to the memory cell until the reversible resistance-switching element resistance reaches at least this target resistance. In one implementation, a programming voltage is applied to a bit line that is coupled to the memory cell. Then, the memory cell's conduction current is compared with $I_{REF}$ to determine whether the reversible resistance-switching element is at least the target resistance. It may be that the programming signal did not RESET the memory cell. That is, the resistance did not reach the target resistance. One possible reason for this is that the programming voltage was not sufficiently high. However, note that RESETTING a memory cell may be more a function of the amount power provided to the memory cell rather than the voltage provided. If the first attempt to RESET the memory cell fails, then another attempt is made until at least the target resistance is reached. If a voltage is being used to RESET the memory cell, then the next programming voltage can be greater than the first, and so forth until the memory cell is programmed.

Figure 8:
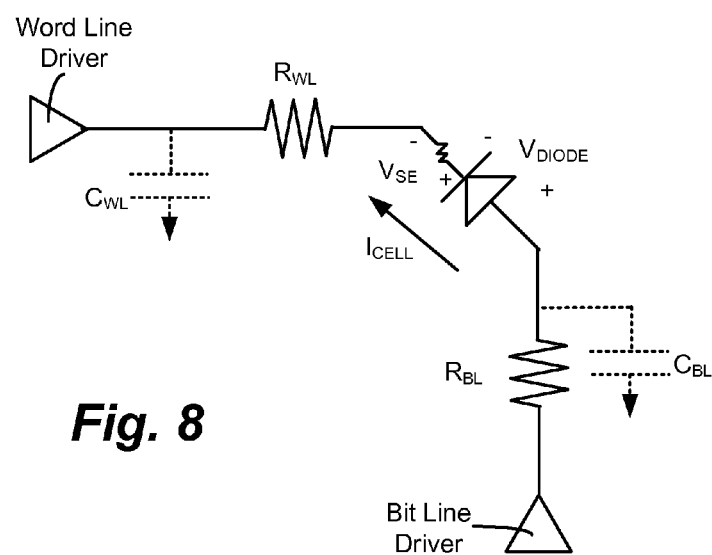
FIG. 8 is a schematic representation of a portion of an electrical circuit used when programming a memory cell.

It can be advantageous to reach the target resistance with few programming cycles, as this can save both time and power. However, due to impedance of other elements electrically connected to the memory cell, not all of the programming voltage is applied to the selected memory cell. Referring to FIG. 8, the bit line driver provides a voltage to one end of the selected bit line and the word line driver grounds one end of the selected word line. The selected bit line has resistance $R_{BL}$, which is a function of the length of the bit line between the memory cell and the bit line driver. The selected word line has resistance $R_{WL}$, which is a function of the length of the word line between the memory cell and the word line driver. The bit line capacitance $C_{BL}$ is depicted in dashed lines to indicate that it is the parasitic capacitance between the bit line and other conductive elements such as adjacent bit lines. The word line capacitance $C_{WL}$ is depicted in dashed lines to indicate that it is the parasitic capacitance between the word line and other conductive elements such as adjacent word lines. Note that the circuit is a simplification and that there may be other elements that could cause voltage drops. For example, there may be other circuitry between the input of the bit line driver and the circuit that generates the programming voltage. Assuming that the memory cell has conduction current $I_{CELL}$ as a result of the bit line driver applying $V_{PROG}$ and the word line driver grounding the end of the word line, then Equation 1 can be written (for steady state):

$$V_{PROG}=(R_{BL}*I_{CELL})+(V_{DIODE})+(V_{SE})+(R_{WL}*I_{CELL}) \quad \text{Eq. 1}$$

In Equation 1, $V_{SE}$ is the voltage across the reversible resistance-switching element. Thus, not all of the programming voltage appears across the reversible resistance-switching element. If the resistance of the reversible resistance-switching element is small compared to other resistances such as bit line and/or word line resistance, then a significant portion of the programming voltage is lost across the bit line and/or the word line. As an example, the total worst case resistance might be 50 kOhm. The worst case resistance refers to resistance other than reversible resistance-switching element resistance for the case of programming a memory cell that is both farthest from its bit line driver and farthest from its word line driver. The best case resistance, which refers to case of programming a memory cell that is both closest to its bit line driver and closest to its word line driver, could be substantially lower. Depending on the address of the memory cell, the combined bit line and word line resistance can range significantly.

Moreover, the resistance of the reversible resistance-switching element itself can vary significantly from one SET memory cell to the next. Referring back to the example resistance distribution for SET memory cells, the resistance range might be 5 kOhm to 100 kOhm. For memory cells at the low end of the resistance range, the resistance may be quite small compared to the combined bit line and word line resistance. Therefore, much of the programming voltage is lost over the selected bit line and/or selected word line. As previously mentioned, RESETTING a memory cell may be a function of the power provided to the memory cell. Referring to the circuit of FIG. 8, the following observations can be made regarding the power provided to reversible resistance-switching elements having different resistances ($R_{CELL}$ is the reversible resistance-switching element resistance).

$$V_{PROG}=(R_{BL}+R_W)*I_{CELL}+V_{DIODE}+R_{CELL}*I_{CELL} \quad \text{Eq. 2}$$

Solving Equation 2 for $I_{CELL}$:

$$I_{CELL}=(V_{PROG}-V_{DIODE})/(R_{CELL}+R_{BL}+R_W) \quad \text{Eq. 3}$$

The power provided to the memory cell ($P_{CELL}$) may be expressed as $I_{CELL}^2 * R_{CELL}$, therefore;

$$P_{CELL}=[(V_{PROG}-V_{DIODE})/(R_{CELL}+R_{BL}+R_W)]^2 * R_{CELL} \quad \text{Eq. 4}$$

If the resistance of the reversible resistance-switching element is 5 kOhm and the combined resistance of the bit line and word line is 50 kOhm, then Equations 5 and 6 regarding the power provided to the reversible resistance-switching element follow.

$$P_{CELL}=[(V_{PROG}-V_{DIODE})/(5\ \text{kOhm}+50\ \text{kOhm})]^2 * 5\ \text{kOhm} \quad \text{Eq. 5}$$

$$P_{CELL}=(V_{PROG}-V_{DIODE})^2/605\ \text{kOhm} \quad \text{Eq. 6}$$

For the case in which the reversible resistance-switching element resistance is 100 kOhm, Equations 7 and 8 can be written:

$$P_{CELL}=[(V_{PROG}-V_{DIODE})/(100\ \text{kOhm}+50\ \text{kOhm})]^2 * 100\ \text{kOhm} \quad \text{Eq. 7}$$

$$P_{CELL}=(V_{PROG}-V_{DIODE})^2/225\ \text{kOhm} \quad \text{Eq. 8}$$

Therefore, the power provided to the reversible resistance-switching element may be significantly more for the 100 kOhm reversible resistance-switching element, as compared to the 5 kOhm reversible resistance-switching element (given the same programming voltage and bit line/word line resistance). Consequently, the 5 kOhm reversible resistance-switching element might need a significantly higher programming voltage than a 100 kOhm reversible resistance-switching element in order to provide the same programming power to the reversible resistance-switching element.

Embodiments disclosed herein take a measurement to estimate the actual reversible resistance-switching element resistance prior to programming. Then, based on known or estimated resistance of other elements coupled to the reversible resistance-switching element (e.g., the selected bit line and word line) an appropriate voltage is determined for programming that memory cell. Other elements such as a diode in the memory cell and bit line and word line drivers may be factored into the determination. In some embodiments, the capacitance of the bit line and word line may be factored in. The programming voltage can be such that approximately the same power is provided to program the reversible resistance-switching elements regardless of their resistance prior to programming. Note that it is not required that the same programming power be provided to each reversible resistance-switching element. For example, a higher programming power might be desirable for reversible resistance-switching elements with lower resistances.

Figure 9:
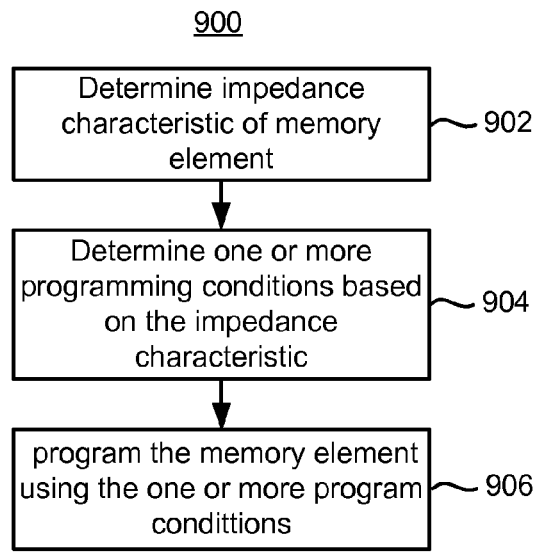
FIG. 9 is a flowchart illustrating one embodiment of a process of programming a memory cell.

FIG. 9 depicts one embodiment of a process 900 for programming a memory cell based on an impedance characteristic of a reversible resistance-switching element in the memory cell. In one implementation, the reversible resistance-switching element is in the SET state prior to process 900. When discussing process 900, an example will be used in which the reversible resistance-switching element is SET prior to process 900 and is RESET during the process 900. However, it will be understood that this is for illustration. In step 902, an impedance characteristic of the reversible resistance-switching element is determined. Note that this does not require that the exact impedance be determined. In one implementation, the impedance characteristic is whether the reversible resistance-switching element resistance is relatively high for the SET state or relatively low for the SET state. In one embodiment, a determination is made whether the conduction current of a memory cell is above or below a demarcation current ($I_{REF}$) in order to determine the impedance characteristic. For example, the demarcation current may be suitable to determine whether the resistance of the reversible resistance-switching element is above or below a certain resistance (e.g., 50 kOhm).

Note that because the resistance in series with the memory cell (see FIG. 8) may be a function of memory cell address, then if the same $I_{REF}$ were to be used for all memory cells, then the address of the memory cells impacts the resistance at which $I_{CELL}$ exceeds $I_{REF}$. In other words, one reversible resistance-switching element might need to be below 45 kOhm and another below 65 kOhm for $I_{CELL}$ to exceed the same $I_{REF}$. In some embodiments, $I_{REF}$ for determining the impedance characteristic is a function of memory cell address to compensate for this factor. However, it is not required that $I_{REF}$ be a function of memory cell address. Thus, it is not required that each reversible resistance-switching element have its resistance compared to the same test resistance. Stated another way, knowing whether the reversible resistance-switching element resistance is relatively high or relatively low within the SET resistance distribution may be enough information about the impedance characteristic. Further details of determining an impedance characteristic are described below.

In step 904, one or more programming conditions are determined based on the impedance characteristic. The programming conditions include a programming voltage and may include one or more other voltages such as an unselected word line voltage. For example, if the resistance of the reversible resistance-switching element is relatively high for the SET state, then a first programming voltage is used. However, if the resistance is relatively low for the SET state, then a second programming voltage is used. Typically, a higher programming voltage is used when the resistance is lower.

In one embodiment, the address of the memory cell is used to determine the resistance of the portions of the selected bit line and the selected word line between the memory cell and the bit line and word line drivers. This resistance value is factored in to the determination of the programming voltage. For example, if the memory cell is close to both the bit line driver and word line driver, then a slightly lower programming voltage may be used as compared to a memory cell that is far from both the bit line driver and word line driver. The following example will be used to illustrate. Consider two memory cells that were each determined to have a 5 kOhm resistance. The combined bit line/word line resistance for one might be 25 kOhm, whereas the combined bit line/word line resistance for the other might be 50 kOhm. The voltage divider effect (see FIG. 8) is considered when determining a suitable programming voltage such that a higher programming voltage is used for the 50 kOhm case.

However, note that it is not a requirement that an address dependent bit line/word line resistance is used in the calculation of the programming voltage. For example, the same bit line and word line resistance can be used in the calculation for all memory cells. As an example, the programming voltage is relatively high for reversible resistance-switching elements with low resistance (e.g., below 20 kOhm) and relatively low for reversible resistance-switching elements with high resistance (e.g., above 20 kOhm). In this example, it is not required that the programming voltage be adjusted based on the address of the memory cell.

In step 906, the memory cell is programmed using the one or more programming conditions that were previously determined. As discussed, the programming conditions include a programming voltage. In one embodiment, the programming voltage is applied to a selected bit line. Because the voltage was adapted to the reversible resistance-switching element resistance, the resistance of the memory cell should have a better chance to reach the desired state (e.g., RESET). However, if applying the programming voltage once does not achieve the desired state, the programming voltage may be re-applied to the selected bit line. However, either a higher or lower programming voltage may be applied to the selected bit line the next time. In some embodiments, process 900 is repeated to determine a new impedance characteristic and new programming voltage if the memory cell did not reach the desired state after applying the programming voltage to the selected bit line.

In some embodiments, other program conditions that were determined based on the impedance characteristic are applied in step 906. For example, a suitable voltage is applied to the unselected word lines while the programming voltage is applied to the selected word line.

The foregoing discusses an example in which two different programming voltages are used. The memory cells can be divided into as many groups as desired, based on their resistances, with a different programming voltage being used for each group. As already discussed, it is not required that the same programming voltage be used for memory cells in the same resistance group, as the address of the memory cell can be used as a factor in determining a suitable programming voltage.

Note that applying a programming signal such as a voltage to the selected bit line does not necessarily mean that a certain voltage across the reversible resistance-switching element is primarily responsible for RESETTING the memory cell. For example, it may be that switching behavior can be better described as providing a certain power to the memory cell. The power provided to the reversible resistance-switching element may be described based on the equation $V^2/R$, where V is the voltage across the reversible resistance-switching element and R is the resistance of the reversible resistance-switching element. In some implementations, a programming voltage is determined that will achieve a desired power provided to the reversible resistance-switching element given the actual reversible resistance-switching element resistance prior to programming and the impedance of other elements in the circuit.

It may also be that switching behavior can be described by heating the reversible resistance-switching element. In some implementations, a programming voltage is selected that will heat the reversible resistance-switching element to a target level given the actual reversible resistance-switching element resistance prior to programming and the impedance of other elements in the circuit.

It may also be that switching behavior can be described by providing a certain energy to the reversible resistance-switching element. In some implementations, a programming voltage is selected that will provide a certain amount of energy to the reversible resistance-switching element given the actual reversible resistance-switching element resistance prior to programming and the impedance of other elements in the circuit.

It may also be that switching behavior can be described by achieving a certain current through the reversible resistance-switching element. In some implementations, a programming voltage is selected that will result in a certain current through the reversible resistance-switching element given the actual reversible resistance-switching element resistance prior to programming and the impedance of other elements in the circuit.

Determining a suitable programming voltage based on the impedance characteristic of the reversible resistance-switching element is not limited to the foregoing examples.

Figure 10:
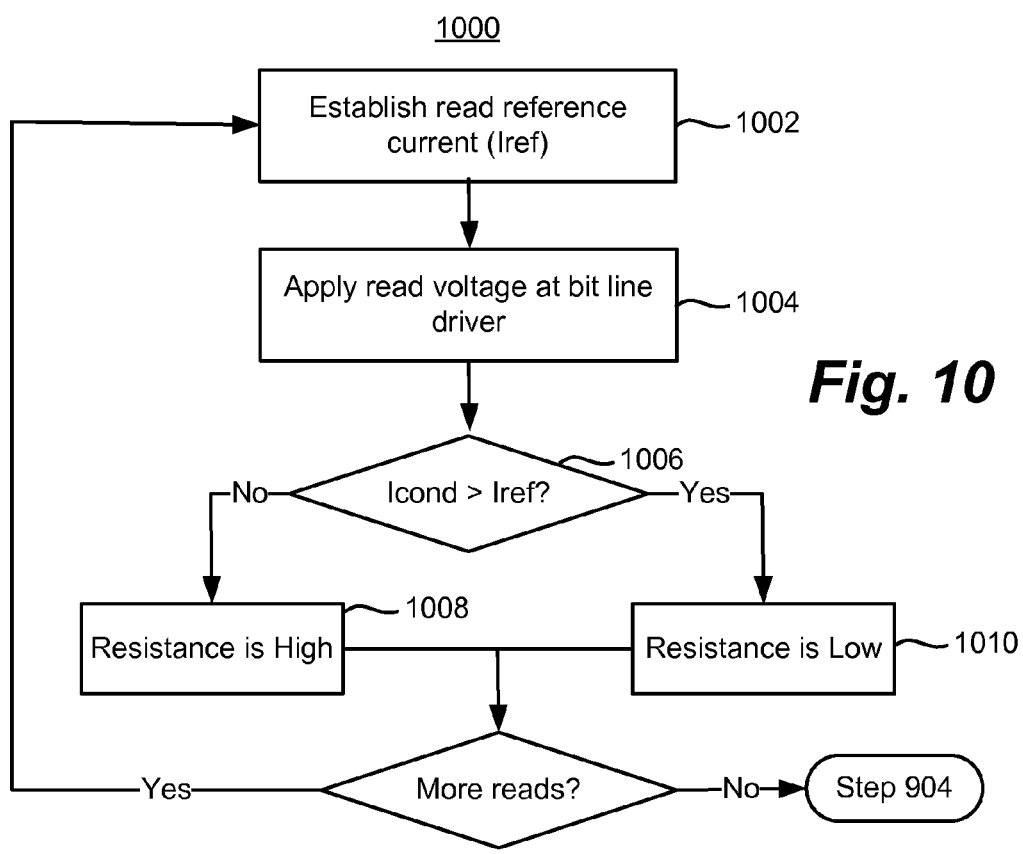
FIG. 10 is a flowchart illustrating one embodiment of a process of determining an impedance characteristic of a reversible resistance-switching element.

FIG. 10 depicts one embodiment of a process 1000 for determining an impedance characteristic of a reversible resistance-switching element. Process 1000 is one implementation of step 902 of process 900. In step 1002, a read reference current is established. The read reference current is established at a level that is used to determine whether the reversible resistance-switching element has a resistance above or below some level. For example, referring to the SET resistance distribution in FIG. 7, it might be desirable to determine whether the resistance is below or above 20 kOhm.

In one embodiment, the read reference current is based on the address of the memory cell. For example, if the memory cell is relatively far from the bit line driver, then a higher $I_{REF}$ might be used to determine whether the resistance is above/below a target resistance. Further details of establishing a read reference current based on the address of a memory cell are described in U.S. Pat. No. 7,218,570, titled, "Apparatus and Method for Memory Operations using Address-Dependent Conditions," which is hereby incorporated by reference herein for all purposes. Note that it is not a requirement that the reference current be based on the address of the memory cell or that the reference current be based on the distance between the memory cell and a bit line driver and/or a word line driver.

In step 1004, a read voltage is applied to the selected bit line by the bit line driver. The read voltage may be 2 V, for example. As discussed in connection with the circuit of FIG. 6, unselected bit lines and the selected word line can be held at ground. About 2 V may be applied to unselected word lines.

In step 1006, the memory cell current is compared with the reference current. As discussed in connection with FIG. 6, this may involve comparing $V_{SENSE}$ with a reference read voltage. If the conduction current is greater than the reference current, then the memory cell is considered to have a relatively low resistance (step 1008). If the reference current is less than the conduction current, then the memory cell is considered to have a relatively high resistance (step 1010). The following is an example calculation for illustrative purposes. Referring to the example circuit of FIG. 8, Equations 9 and 10 can be written assuming that Vread is applied to the bit line and the word line is grounded:

$$V_{READ} = (R_{BL} * I_{CELL}) + (V_{DIODE}) + (R_{SE} * I_{CELL}) + (R_{WL} * I_{CELL}) \quad \text{Eq. 9}$$

$$R_{SE} = [V_{READ} - (V_{DIODE}) - (R_{BL} * I_{CELL}) - (R_{WL} * I_{CELL})] / I_{CELL} \quad \text{Eq. 10}$$

Values for $R_{BL}$ and $R_{WL}$ may be determined based on the memory cell address. A value for $V_{DIODE}$ may be estimated based on diode characteristics. $V_{READ}$ is known from the read voltage applied. If desired, additional refinements can be made based on electrical characteristics of the bit line driver and word line driver. Also, there could possibly be other circuit elements to consider, such as a dataline coupled to the bit line driver (not depicted in FIG. 8). That is, it may be that $V_{READ}$ is actually applied to a dataline and not the input of the bit line driver.

From the above equations, it is evident that if the conduction current, $I_{CELL}$, is greater than the reference current, $I_{REF}$, then the following inequality can be derived:

$$R_{SE} < [V_{READ} - (R_{BL} * I_{REF}) - (V_{DIODE}) - (R_{WL} * I_{REF})] / I_{REF} \quad \text{Eq. 11}$$

Likewise, it is evident that if the conduction current, $I_{CELL}$, is less than the reference current, $I_{REF}$, then the following inequality can be derived:

$$R_{SE} > [V_{READ} - (R_{BL} * I_{REF}) - (V_{DIODE}) - (R_{WL} * I_{REF})] / I_{REF} \quad \text{Eq. 12}$$

Therefore, based on the comparison of step 1006, the reversible resistance-switching element can be classified as having a resistance that is either above or below $R_{SE}$. Note that in this example, the bit line resistance and word line resistance are a function of the memory cell address. Therefore, given the same $I_{REF}$, the value $R_{SE}$ may be different for memory cells having different addresses. For example, it may be that $R_{SE}$=20 kOhm for a memory cell with one address and 25 kOhm for a memory cell with a different address. However, as previously mentioned, in some embodiments, the value for $I_{REF}$ is varied based on memory cell address. In this case, with a suitable selection of $I_{REF}$, the address dependency of $R_{SE}$ may be reduced or eliminated. Thus, all memory cells could be characterized in terms of the same resistance, $R_{SE}$. As a specific example, all memory cells could be characterized as having a resistance that is either above or below 20 kOhm.

Process 1000 may conclude at this point. Therefore, determining a programming voltage (step 904, FIG. 9) can be based on the impedance information gathered so far. However, if desired, the impedance information can be refined by applying one or more additional read voltages. If so, a new read reference current is established in step 1002. As an example, if the first read determined that the resistance was relatively low (e.g., below 20 kOhm), the next read can be performed to determine whether the resistance is above/below 10 kOhm (or some other value). On the other hand, if the first read determined that the resistance was above 20 kOhm (or some other value), then the next read can determine whether the resistance is above/below 50 kOhm (or some other value). As discussed above, it is not required that each memory cell be tested for the same resistance. Also, as discussed above, a different reference current (e.g., address dependent) might be used to test whether different memory cells have the same resistance. The determination of whether to perform additional reads can be based on the resistance value that was calculated. For example, if it is determined that the resistance is above or below a certain value there may not be a need to perform additional measurements. Process 1000 repeats until the impedance is determined at a desired accuracy.

Figure 11:
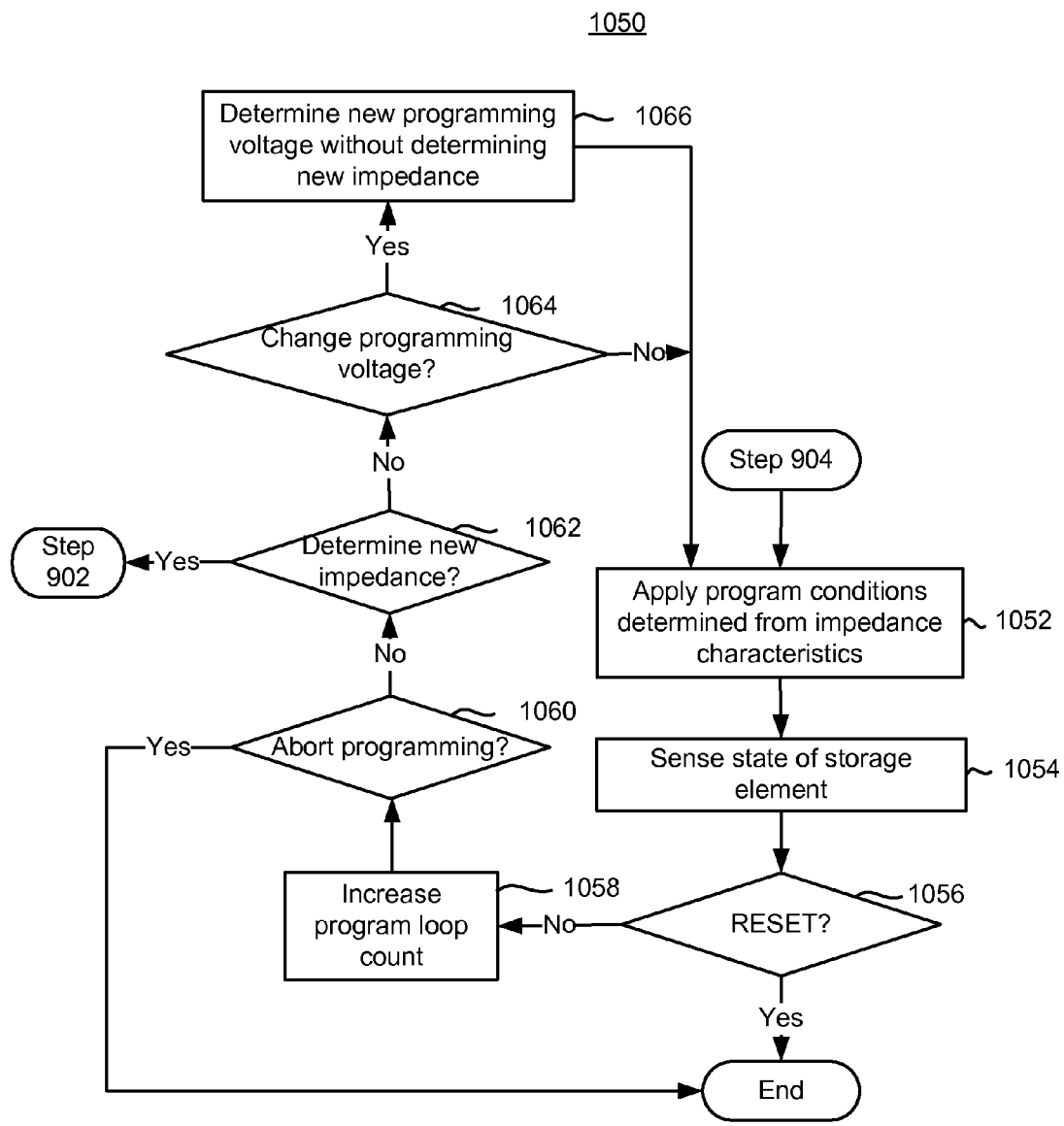
FIG. 11 is a flowchart illustrating one embodiment of a process of programming a memory cell using program conditions determined from an impedance characteristic.

FIG. 11 depicts a flowchart of one embodiment of a process 1050 for programming a memory cell using a determined impedance characteristic. Process 1050 is one embodiment of step 906 of FIG. 9 and may begin following step 904. For the sake of illustration process 1050 will refer to RESETTING a single memory cell. However, process 1050 is not limited to RESETTING a memory cell. Typically, more than one memory cell is programmed in parallel. Thus, process 1050 can be performed in parallel on different memory cells. In step 1052, program conditions that were determined based on impedance conditions are applied to bit lines and word lines.

In step 1054, the state of the memory cell is determined. The circuit of FIG. 6 may be used to determine whether the conduction current of the memory cell is less than a reference current. In one embodiment, the reference current depends on the address of the memory cell.

If the memory cell is determined to have been RESET (step 1056), then the process 1050 is complete. Otherwise, a program loop count is incremented and saved at step 1058. If the program loop count is higher than a limit, then programming is aborted (step 1060).

Note that if programming was not successful, then the resistance of the memory cell may have changed substantially. In step 1062, a determination is made whether a new impedance should be determined. Therefore, a new impedance characteristic for the memory cell may be determined. However, it may not be necessary to determine a new impedance with each (or any) iteration of process 1050. Whether to determine a new impedance can be based on factors such as the present loop count, the present impedance, the present program voltage, the number of program loops since the impedance was last determined, etc. If a new impedance is to be determined, control passes to step 902 of FIG. 9 to determine a new impedance characteristic. Then, one or more new programming conditions may be determined in step 904. The programming conditions include a programming voltage, which is applied by repeating process 1050 starting at step 1052.

If a new impedance characteristic is not to be determined, then process 1050 continues at step 1064 to determine whether the programming voltage (and/or other programming conditions such as unselected word line voltages) should change. Note that it may be desirable to use a higher, lower, or the same programming voltage the next iteration. The determination of whether to change the programming voltage and by how much may be based on factors that can change with each program loop. If the same programming voltage is to be used, then process 1050 proceeds to step 1052. Otherwise, a new programming voltage (and possibly other programming parameters) are determined in step 1066. Then, the new conditions are applied in step 1052.

In some embodiments, the impedance of the memory cell is factored into RESETTING a memory cell but not into SETTING a memory cell. A reason for this is that the resistance of all RESET memory cells may be much larger than the combined resistance of other circuit elements. Therefore, there may not be much difference in the programming voltage or power that each memory cell experiences for a SET operation. However, this may not be the case for all memory cell materials or memory array structures. Therefore, it is possible to factor in the memory cell impedance when SETTING a memory cell, if desired. Also note that if the memory cell is programmed to more states than SET and RESET, then determining a programming voltage based on the impedance can be used for other states.

Figure 12A:
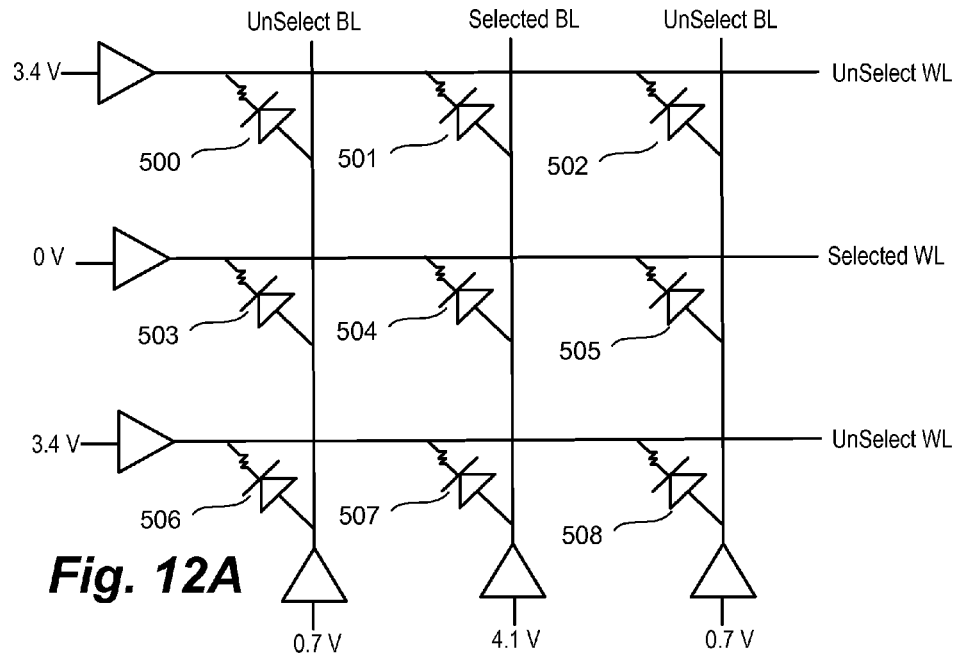
FIG. 12A depicts a schematic of one embodiment of signals applied to word lines and bit lines when programming a non-volatile storage element that is near both bit line and word line drivers.
Figure 12B:
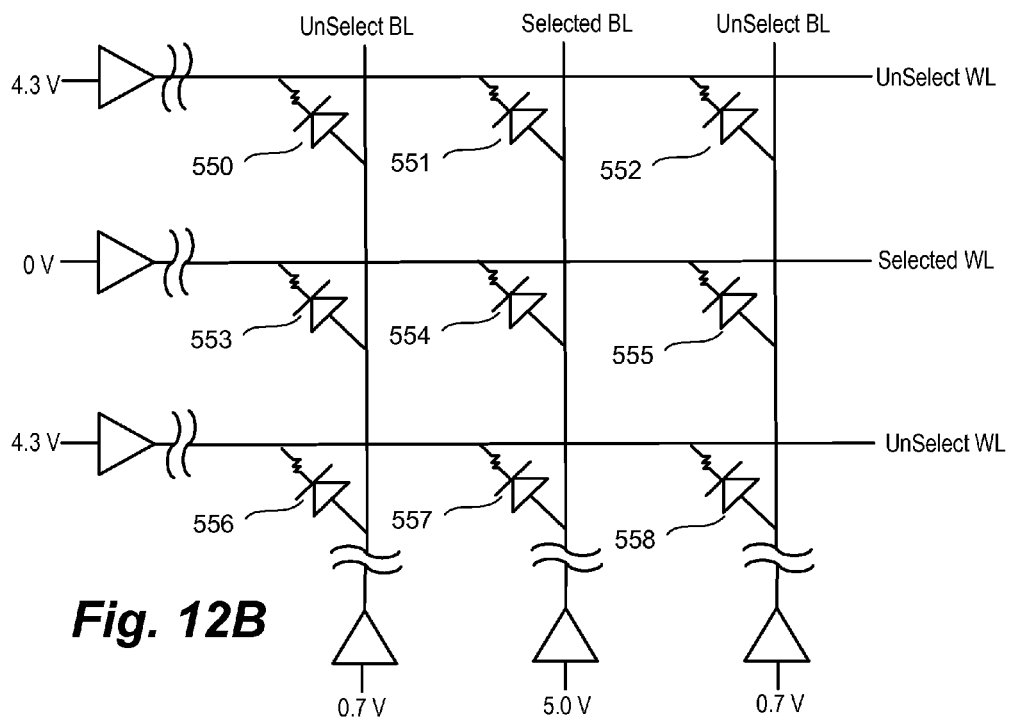
FIG. 12B depicts a schematic of one embodiment of signals applied to word lines and bit lines when programming a non-volatile storage element that is far from both bit line and word line drivers.

As has been mentioned earlier, it can be difficult to meet programming bandwidth requirements while staying within a worst case current and/or power consumption. FIGS. 12A and 12B will be discussed to provide insight into current and power consumption issues. FIGS. 12A and 12B depict one embodiment of schematic diagrams showing signals that are supplied to bit lines and word lines during SET and RESET operations. FIG. 12A shows nine memory cells 500-508, each of which includes a steering element (e.g., diode) and a reversible resistance-switching element. Each memory cell is associated with one bit line and one word line. In this example, each memory cell is relatively close to its respective bit line driver and word line driver.

FIG. 12B shows nine memory cells 550-558, each of which includes a steering element (e.g., diode) and a reversible resistance-switching element. Each memory cell is relatively far from its respective bit line drivers and word line drivers (as represented by the broken lines) in this case. In this example, all of the bit line drivers are at the same end of the bit lines. Also, all of the word line drivers are at the same end of the word lines in this example. However, that is not a requirement. In one implementation, bit line drivers are staggered such that they are at one end of odd bit lines and the other end of even bit lines. In one implementation, word line drivers are at one end of odd word lines and the other end of even word lines. In one embodiment, the memory cells of FIGS. 12A and 12B are based on the embodiment of FIG. 1. The arraignment of bit lines and word lines may be a small part of any of the structures of FIG. 2, 3 or 4, or another structure may be used.

In FIG. 12A, memory cell 504 is being programmed. In this case, 4.1 volts is applied by the selected bit line driver to the selected bit line. The selected word line is grounded by the selected word line driver. Therefore, a current flows through the portion of the selected bit line that connects memory cell 504 to the bit line driver and also through the portion of the selected word line that connects memory cell 504 to ground (or other voltage provided by the word line driver). Therefore, due to the non-zero resistance of the selected bit line and selected word line there will be an IR voltage drop across portions of the selected bit line and the selected word line. Consequently, not all of the voltage applied by the bit line driver will be applied across the reversible resistive-switching element (depicted as a resistor) within memory cell 504. Herein, the term "IR voltage drop" will be used as shorthand to refer to the voltage drop across portions of the selected bit line and the selected word line between the bit line driver and word line driver that current flows through when programming a memory cell. Memory cell 504 may be referred to as a "near-near" memory cell as it is near both the bit line driver and the word line driver.

In FIG. 12B, memory cell 554 is being programmed. Memory cell 554 is relatively far from the bit line driver at the end of the selected bit line, as depicted by the break in the bit line. Furthermore, memory cell 554 is relatively far from the word line driver at the end of the selected word line. Therefore, the current flows through a longer section of the selected bit line when programming memory cell 554. Furthermore, the current flows through a longer section of the selected word line when programming memory cell 554. If the memory cell current is the same for both memory cell 504 and 554, then there will be a greater IR voltage drop for memory cell 554. Of course, even if the memory cell current is less for memory cell 554, there still might be a greater IR drop. Memory cell 554 may be referred to as a "far-far" memory cell, as it is far from both the bit line driver and the word line driver.

In some implementations, in order to account for the different IR voltage drops that occur when programming different memory cells, the voltages that are applied to the word lines and bit lines during programming are based on the physical location of the memory cell that is being programmed relative to its bit line driver and/or word line driver. In the scheme depicted in FIGS. 12A and 12B, it is the selected bit line voltage and unselected word line voltage that vary depending on which memory cell is being programmed. In the example of FIG. 12A, in which the memory cell 504 is relatively near both drivers, 4.1 V is applied by the bit line driver to the selected bit line and 0 V is applied by the word line driver to the selected word line. Note that 3.4 V is applied to unselected word lines. This results in the diodes for memory cells 501 and 507 being neither forward biased nor reverse biased. Note that while FIG. 12A only depicts two unselected word lines, there may be thousands of unselected word lines associated with the selected bit line. Therefore, reverse bias current in unselected memory cells that are coupled between an unselected word line and an unselected bit line could possibly become quite large. However, appropriate selection of the voltage to unselected word lines can keep the reverse bias current (as well as forward bias current) to a minimum.

Referring to FIG. 12B, 5.0 V is applied to the selected bit line, while the selected word line is grounded, to program memory cell 554. Thus, a slightly higher voltage is applied to the selected bit line in this case in which the memory cell is relatively far from the bit line driver (as well as the word line driver). In this case, 4.3 V is applied to the unselected word lines, which is also higher than the case of FIG. 10A. A reason for this higher unselected word line voltage is to prevent unselected memory cells along the selected bit line from being programmed. In both FIG. 12A and 12B, 0.7 V is applied to unselected bit lines, which is not sufficient to cause the diode in memory cells 503, 506, 553, and 556 to have a significant current (forward or reverse).

In some implementations, more than one memory cell along the selected word line is programmed concurrently. For example, memory cell 503 could be programmed concurrently with memory cell 504 by applying 4.1 V to its bit line. Note that with each additional memory cell that is programmed along the selected word line, the word line current will increase. Therefore, the IR drop associated with the word line increases. If an attempt is made to program too many memory cells along the selected word line, then there might not be a sufficient voltage across one of the memory cells to program it. Therefore, it may be desirable to not program too many memory cells along the selected word line. In order to increase the programming bandwidth, memory cells in different bays may be programmed in parallel. However, there are still current and power consumption issues that can limit how many memory cells can be programmed in parallel in different bays. One embodiment is a page mapping scheme that is used to increase programming bandwidth while staying within worst case current/power consumption. A page mapping embodiment will be discussed more fully below.

Continuing with the discussion of FIGS. 12A and 12B, note that the voltage applied to the selected bit line can be based not only on distance from the memory cell to the bit line driver, but also to the word line driver. For example, memory cell 504 is a near-near element (near bit line driver and near word line driver). However, a memory cell on the other end of the selected word line will be a near-far element (near a bit line driver, but far from a word line driver). Thus, there may be a greater IR drop across the word line when programming the near-far memory cell. Consequently, the voltage applied to the selected bit line could be slightly more than 4.1V for the near-far element. Note that if a higher voltage is applied to a selected bit line, then a higher voltage may also be applied to the unselected word lines in order to prevent the unselected memory cells along the selected bit line from conducting a current. For example, if 4.3V were applied to the selected bit line, then 3.6 V might be applied to the unselected word lines.

Note that it is not required that the selected bit line voltage be a function of the distance from the selected memory cell to both its bit line driver and to its word line driver. In some implementations, the bit lines are substantially longer than the word lines due at least in part to there being many more word lines than bit lines in a block. For example, there may be about eight word lines for every bit line. In such implementations, for a typical memory cell, the resistance along a selected word line may be much less than the resistance along a selected bit line. Therefore, the selected word line resistance may be ignored. In other implementations, the resistance along the selected word line might be more significant than the resistance along the selected bit line. Therefore, the programming voltage might be a function of the distance from the selected memory cell to its word line driver and not to its bit line driver.

FIGS. 12A and 12B depict the most extreme cases for distance between the memory cells and drivers. Some memory cells will be near a bit line driver, but far from a word line driver. Others will be far from a bit line driver, but close to a word line driver. Of course, some will be a moderate distance from one or both of the bit line and word line drivers. Appropriate voltages can be determined based on the distances from the memory cell and drivers. For example, a selected bit line voltage between 4.1V and 5.0V would be appropriate for some memory cells. Note that the distance from a memory cell to its drivers can be correlated to the address of the memory cell. Further details of applying different programming conditions to memory cells based on their addresses are discussed in U.S. Pat. No. 7,218,570, which has previously been incorporated by reference in its entity for all purposes.

In view of the foregoing, when more than one memory cell is programmed on a given word line in a block, it may be convenient to program only those that are about the same distance from the bit line drivers for that word line. For example, if an attempt were made to program memory cell 504 ("near-near") with a memory cell on the other end of the word line ("near-far"), it could be difficult to provide appropriate voltages to unselected word lines. For example, when programming multiple memory cells on the same word line in a block, multiple near-near memory cells may be programmed currently or, alternatively, multiple far-far memory cells are programmed currently. However, it may be desirable to not program a far-far memory cell concurrently with a near-near memory cell in the same block. In some embodiments, a page mapping scheme is used such that one or more near-near memory cells in one block are programmed concurrently with one or more far-far memory cells in another block. This page mapping scheme may reduce the worst case power consumption when programming memory cells in different block in parallel. In some embodiments, the different blocks are in different bays.

Next, issues involving current (as well as power) consumption when programming will be discussed. Note that it may be desirable to keep the worst case current consumption below a target level due to limitations of how much current can be drawn at any one time by the memory device (or at least by portions of the memory device that are involved in programming). There may also be worst case limitations on power consumption. For unselected memory cells such as element 500 in FIG. 12A, there may be some reverse bias current due to the voltage differential between the unselected word line and unselected bit line. However, this reverse bias current should not cause the memory cell 500 to SET or RESET. Regardless, there may be some current and power consumption due to the reverse biasing of the diodes. For example, in FIG. 12A, there may be a reverse bias current in the diodes of memory cells 500, 502, 506, and 508 due to the difference between the 3.4 V applied to the unselected word lines and the 0.7 V applied to the unselected bit line. Note that there may be some voltage drop moving to the right along the unselected word lines. Therefore, the reverse bias current could be smaller for unselected memory cells on bit lines further to the right (no depicted in FIG. 12A).

In the example of programming a far-far memory cell 554 in FIG. 12B, significantly higher voltages are applied to the unselected word lines. Therefore, overall there will be more reverse bias current in unselected memory cells. Also, because the programming current travels through a longer section of bit line and word line, there will be more power consumed along the selected bit line/word line when programming a far-far cell than a near-near cell for the same programming current.

In view of the foregoing considerations, the worst case current and/or power consumption when concurrently programming memory cells in different blocks can be reduced by programming a near-near memory cell in one block concurrently with a far-far memory cell in another block. As previously discussed, the different blocks may be in different bays. For purposes of discussion, an example page mapping scheme will be discussed in which the blocks are in different bays. However, it is not required that the different blocks be in different bays.

A page mapping scheme is disclosed herein in which a given page is mapped to word lines in a manner that minimizes the worst case current and/or power consumption that might occur when programming the memory array. As previously discussed, each block has a number of word lines, which can be assigned numbers based on location. In some embodiments, a page is mapped such that the page is written to different numbered word lines in different bays. For example, if the page is divided into four pieces, the pieces might be written to four different bays as Table 1 shows.

TABLE 1

| Bay | 0 | 1 | 2 | 3 |
|---|---|---|---|---|
| Block | 0 | 0 | 0 | 0 |
| WL | 0 | 0 | 1 | 1 |
| BL | 0 | 0 | 1 | 1 |
| Location | near-near | near-near | far-far | far-far |
| Power | low | low | high | high |
| Current | low | low | high | high |

In this example, odd bit lines have drivers on one end of the bit lines and even bit lines have drivers on the other end of the bit lines. Likewise, odd word lines have drivers on one end of the word lines and even word lines have drivers on the other end. The combination of WL0 and BL0 is a "near-near" combination (close to the bit line driver of the selected bit line and close to word line driver of selected word line). The combination of WL1 and BL1 is a "far-far" combination (far from the bit line driver of the selected bit line and far from word line driver of selected word line). Note that programming a far-far memory cell may consume more power (for the entire block) than programming a near-near memory cell. Programming a far-far memory cell may also consume more current (for the whole block) than programming a near-near memory cell. In some embodiments, programming a far-far cell is the worst case in terms of current/power requirements and near-near may be the best case. Thus, in two of the blocks power consumption is the worst case and on two of the blocks power consumption is the best case. This page mapping scheme reduces the overall worst case current/power consumption. For example, were a far-far memory cell programmed concurrently in all four blocks, then the power consumption when programming these memory cells would be much higher for that particular programming effort.

In the above example, a single memory cell is programmed in each block. However, multiple memory cells can be written in each block in parallel. As a specific example, several near-near memory cells on WL0 may be programmed in parallel in bay 0 and bay 1, while several far-far memory cells on WL1 are programmed in parallel in bay 2 and bay 3. For example, memory cells on BL0, BL2, BL4 and BL6 might be written on WL0 in block 0 of bays 0 and 1, whereas memory cells on BL1, BL3, BL5 and BL7 might be written on WL1 in block 0 of bays 2 and 3.

Note that the page mapping scheme may be extended for memory cells that are not near-near and far-far in a way that reduces worst case current/power consumption. The exact mapping scheme may depend on factors such as the overall bit line length (or resistance) and overall word line length (or resistance). Also, while the example above contemplates factoring in the distance between the selected memory cell and both the bit line driver and the word line driver, it is not required to factor in the distance to both drivers. In some embodiments, the distance to the bit line driver is considered but not the distance to the word line driver. This embodiment may be useful in cases in which the bit lines are substantially longer (or have higher resistance) than the word lines. In some embodiments, the distance to the word line driver is considered but not the distance to the bit line driver.

Figure 13:
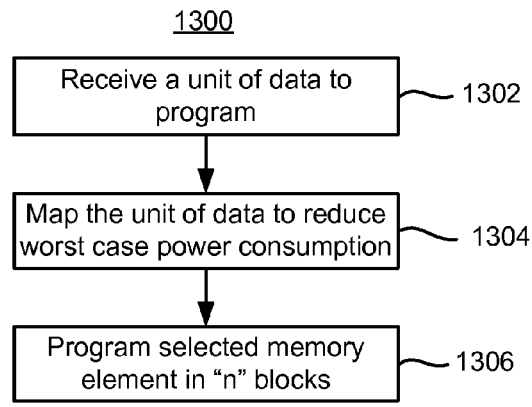
FIG. 13 is a flowchart illustrating one embodiment of a process of programming memory cells to minimize a worst case power or current consumption.

FIG. 13 is a flowchart of one embodiment of a process 1300 for concurrently programming memory cells in different blocks. Process 1300 uses a mapping scheme that reduces the worst case power and/or current consumption. In step 1302, a unit of data is received for programming. In one embodiment, the unit of data is a page. A page of data may be any size. When discussing process 1300 an example is provided in which the mapping scheme is referred to as a "page mapping" scheme for the case in which the unit of data is a page. However, it will be understood that the mapping scheme is not limited to pages of data.

In step 1304, the unit of data is mapped to non-volatile storage elements in different blocks a way that reduces the worst case power consumption, assuming that storage elements in different blocks are programmed in parallel. The following are various examples of page mapping schemes that may be used to reduce the worst case current/power consumption. However, it will be understood that mapping to reduce worst case current/power consumption is not limited to these examples. In these examples, the blocks are in different bays, but that is not a requirement.

TABLE 2

|  |  |  |  |  | Power/Current | |
|---|---|---|---|---|---|---|
|  |  |  |  |  | Bay 0-1 | Bay 2-3 |
| Bay | 0 | 1 | 2 | 3 |  |  |
| Block | 0 | 0 | 0 | 0 |  |  |
| BL | 0 | 0 | 0 | 0 |  |  |
| WL | 0 | 0 | 1023 | 1023 | Low | High |
| WL | 1 | 1 | 1022 | 1022 | Low | High |
| WL | 2 | 2 | 1021 | 1021 | Low | High |
| ... | ... | ... | ... | ... |  |  |
| WL | 1023 | 1023 | 0 | 0 | High | Low |

In the example in Table 2, there are 1024 word lines per block. This example pertains to programming BL0 of block 0 in bays 0 and 1, while concurrently programming BL0 of block 0 in bays 2 and 3. In this example, all of the bit line drivers are located close to WL0 (that is, they are not staggered at opposite ends of the bit lines). Further, only the distance from the memory cell to the selected bit line driver is factored in to the page mapping scheme.

The mapping scheme identifies memory cells that are to be programmed in parallel. In this example, the table rows that identify the word lines serve to identify the memory cells that are to be programmed in parallel. For example, when programming on WL0 in bays 0 and 1, WL1023 is programmed in bays 2 and 3 (for BL0). As can be seen from Table 2, when programming memory cells that are relatively close to the bit line driver in bays 0 and 1, the memory cells being programmed are relatively far from the bit line driver in bays 2 and 3. In this case, the current/power consumption for bays 0-1 is relatively low, whereas the current/power consumption for bays 2-3 is relatively high. Conversely, when programming memory cells that are relatively far from the bit line driver in bays 0 and 1, the memory cells are relatively close the bit line driver in bays 2 and 3. In this case, the current/power consumption for bays 0-1 is relatively high, whereas the current/power consumption for bays 2-3 is relatively low. Therefore, the page mapping scheme avoids programming memory cells in different blocks where all blocks use high current/power. Also note that word lines associated with medium power consumption may be paired with other word lines associated with medium power consumption. Therefore, the worst case current/power consumption is reduced.

The page mapping scheme may also be based on the distance between the selected memory cell and the word line driver. In this case, different bit lines may be programmed in bays 0 and 1 than in bays 2 and 3. The following table considers factoring in only the distance between the selected memory cells and the word line drivers.

TABLE 3

|  |  |  |  |  | Power/Current | |
|---|---|---|---|---|---|---|
|  |  |  |  |  | Bay 0-1 | Bay 2-3 |
| Bay | 0 | 1 | 2 | 3 |  |  |
| Block | 0 | 0 | 0 | 0 |  |  |
| WL | 0 | 0 | 0 | 0 |  |  |
| BL | 0 | 0 | 8191 | 8191 | Low | High |
| BL | 1 | 1 | 8190 | 8190 | Low | High |
| BL | 2 | 2 | 8189 | 8189 | Low | High |
| ... | ... | ... | ... | ... |  |  |
| BL | 8191 | 9191 | 0 | 0 | High | Low |

In example in Table 3, the same blocks and bays are programmed as the previous example. There are 8192 bit lines per block in the example. In this example, all of the word line drivers are closest to BL0 and only the distance from the selected word line driver is factored in to the page mapping scheme. As can be seen from Table 3, when programming memory cells that are relatively close to the word line driver in bays 0 and 1, the memory cells being programmed are relatively far from the bit line driver in bays 2 and 3. In this case, the current/power consumption for bays 0-1 is relatively low, whereas the current/power consumption for bays 2-3 is relatively high. Conversely, when programming memory cells that are relatively far from the word line driver in bays 0 and 1, the memory cells being programmed are relatively close the word line driver in bays 2 and 3. In this case, the current/power consumption for bays 0-1 is relatively high, whereas the current/power consumption for bays 2-3 is relatively low. Therefore, the page mapping scheme avoids programming memory cells in different blocks where all blocks use high current/power. Therefore, the worst case current/power consumption is reduced.

As has been previously discussed, both bit line drivers and word line drivers may be staggered such that half are at each end of the bit lines or word lines. As an example, odd/even staggering may be used. The page mapping scheme may be altered to cover such a configuration.

Also, the page mapping scheme can be made more complex by factoring in the distance from the selected memory cell and both the selected word line driver and the selected bit line driver. An example of this scheme has already been discussed in which one memory cell is farthest from both its bit line and word line driver and another is closest to both its bit line and word line driver. The details of the exact page mapping scheme for other memory cells may determined by analyzing the current/power consumption when programming memory cells at each of the locations and arriving at a solution that reduces the worst case power and/or current consumption.

In one embodiment, step 1304 involves selecting a first and a second memory cell in two different blocks such that the following condition is met. Either the first memory cell is farther from either its bit line driver than the second memory cell is from its bit line driver or the first memory cell is farther from either its word line driver than the second memory cell is from its word line driver. In one embodiment, both conditions are met.

In step 1306, at least one memory cell in each of at least two different blocks is programmed based on the mapping scheme. In one embodiment, the two different blocks are in two different bays. As has been discussed earlier, the process of programming a memory cell may involve more than one iteration Programming in parallel means that for at least one iteration (e.g., the first iteration), program conditions are applied to bit lines and word lines in different blocks in order to attempt to program different memory cells. Note that the programming could be a SET or a RESET operation.

Figure 14:
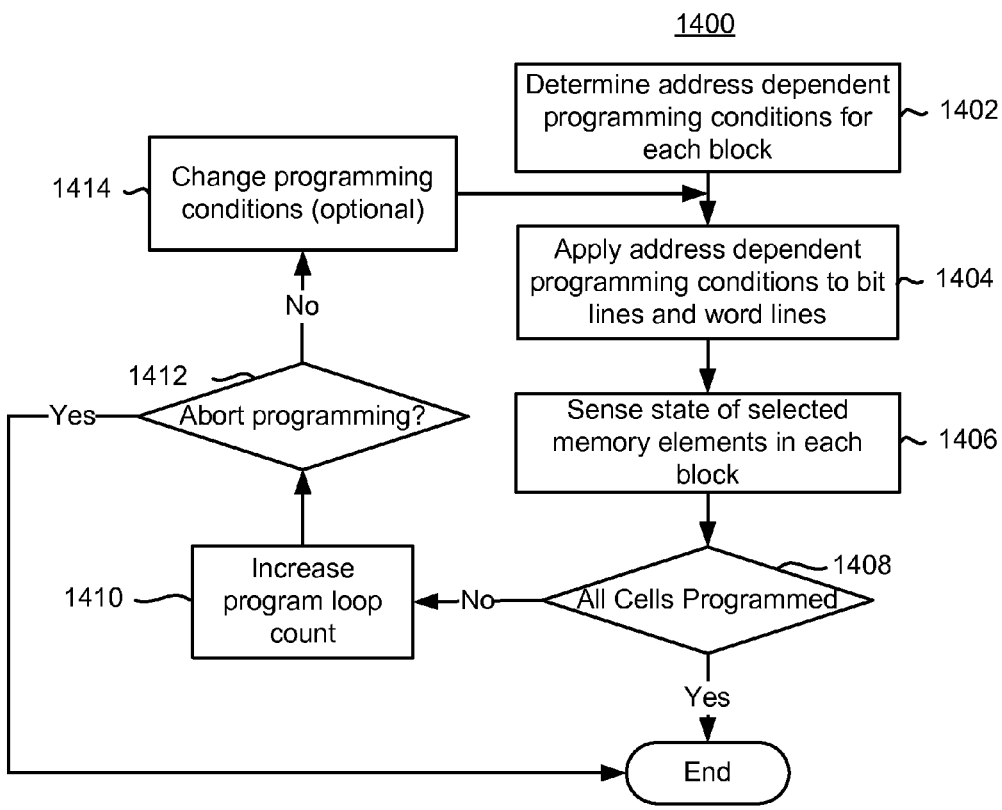
FIG. 14 depicts one embodiment of a process for programming memory cells based on a page mapping scheme.

FIG. 14 depicts one embodiment of a process 1400 for programming memory cells based on a page mapping scheme. Process 1400 is one implementation of step 1306 of process 1300. For purposes of illustration, process 1400 will be discussed using an example in which a near-near element is programmed in block A while programming a far-far element in block B. Note that there may be more than two blocks being programmed. For example, there might be two or more blocks that are programmed using the conditions for block A. Likewise, there might be two or more blocks programmed using the conditions for block B. The blocks may be in different bays, but that is not required.

In step 1402, address dependent programming conditions are determined for each of the blocks. In some embodiments, different address dependent conditions are used for blocks A and B. For example, one set of conditions are used for block A in which the selected memory cell is a near-near element and a second set of conditions are used for block B in which the selected memory cell is a far-far element. Referring to FIGS. 12A and 12B as an example, the programming conditions in Table 4 may be used.

TABLE 4

| Block | Unsel BL | Select BL | Unsel WL | Select WL |
|---|---|---|---|---|
| A (near-near) | 0.7 V | 4.1 V | 3.4 V | 0 |
| B (far-far) | 0.7 V | 5.0 V | 4.3 V | 0 |

In step 1404, the address dependent programming conditions are applied to bit lines and word lines in the different blocks.

In step 1406, each of the selected memory cells is tested to determine whether the memory cell has been programmed (e.g., either SET or RESET). The circuit of FIG. 6 may be used to determine whether the memory cell is programmed. In one embodiment, $I_{REF}$ is based on the memory cell address.

If all of the memory cells are programmed to the desired state (step 1408), then process 1400 ends. Otherwise, the process continues at step 1410 in which a program loop count is incremented. If the loop count is too high, programming is aborted (step 1412) and process 1400 ends. When programming fails for a memory cell in a given block, that block can be marked as a bad block.

If the program loop count is not too high, then process 1400 continues at step 1414 in which the programming conditions may optionally be altered for those memory cells that failed to program. For example, if a memory cell fails to program it may be desirable to increase the programming voltage. However, the programming voltage may be kept the same, or even decreased. After optionally changing the programming conditions in step 1414, process 1400 then proceeds to step 1404, wherein the program conditions are applied for those blocks that still have a memory cell to program. The process ends when all memory cells are programmed, or programming fails as a result of too many iterations.

Note that when programming using the page mapping scheme, impedance conditions can be determined in order to determine suitable programming voltages. However, it is not required that impedance conditions are determined.

In many of the circuit diagrams described above, the depicted circuits can be replaced by the dual of these circuits where NMOS and PMOS device types are exchanged and positive voltages are exchanged with negative voltages.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage device, including:

a plurality of blocks, each block includes a plurality of reversible resistance-switching elements, each block includes a plurality of word lines, each block includes a plurality of word line drivers, each block includes a plurality of bit lines, and each block includes a plurality of bit line drivers, each reversible resistance-switching element is coupled to one of the word lines and one of the bit lines, each reversible resistance-switching element is associated with one of the bit line drivers and one of the word line drivers; and one or more management circuits in communication with the reversible resistance-switching elements, the one or more management circuits concurrently program a first reversible resistance-switching element in a first of the blocks and a second reversible resistance-switching element in a second of the blocks, the first reversible resistance-switching element is farther from one or both of the bit line driver or the word line driver that is associated with the first reversible resistance-switching element than the second reversible resistance-switching element is from one or both of the bit line driver or the word line driver that is associated with the second reversible resistance-switching element.

2. The non-volatile storage device of claim 1, wherein the one or more management circuits receives a page of data to be stored in the non-volatile storage, the one or more management circuits divide the page of data into multiple portions, a first of the portions includes a first bit and a second of the portions includes a second bit, the one or more management circuits programming the first reversible resistance-switching element and the second reversible resistance-switching element in parallel includes the one or more management circuits storing the first bit in the first reversible resistance-switching element and storing the second bit in the second reversible resistance-switching element.

3. The non-volatile storage device of claim 1, wherein the one or more management circuits selecting a reversible resistance-switching element in at least two of the blocks includes the one or more management circuits selecting the first reversible resistance-switching element and the second reversible resistance-switching element based on the distance that the first reversible resistance-switching element is from the bit line driver associated with the first reversible resistance-switching element and the distance that the second reversible resistance-switching element is from the bit line driver associated with the second reversible resistance-switching element.

4. The non-volatile storage device of claim 3, wherein the one or more management circuits selecting a reversible resistance-switching element in at least two of the blocks includes the one or more management circuits selecting the first reversible resistance-switching element and the second reversible resistance-switching element further based on the distance that the first reversible resistance-switching element is from the word line driver associated with the first reversible resistance-switching element and the distance that the second reversible resistance-switching element is from the word line driver associated with the second reversible resistance-switching element.

5. The non-volatile storage device of claim 1, wherein the one or more management circuits selecting a reversible resistance-switching element in at least two of the bays includes the one or more management circuits selecting the first reversible resistance-switching element and the second reversible resistance-switching element based on the distance that the first reversible resistance-switching element is from the word line driver associated with the first reversible resistance-switching element and the distance that the second reversible resistance-switching element is from the word line driver associated with the second reversible resistance-switching element.

6. The non-volatile storage device of claim 1, wherein the one or more management circuits programming the first reversible resistance-switching element and the second reversible resistance-switching element in parallel includes the one or more management circuits applying a first voltage to unselected word lines in the first bay and applying a second voltage to unselected word lines in the second bay, the first voltage is greater than the second voltage.

7. The non-volatile storage device of claim 6, wherein the one or more management circuits programming the first reversible resistance-switching element and the second reversible resistance-switching element in parallel includes the one or more management circuits applying a third voltage to the first selected bit line in the first bay and applying a fourth voltage to the second selected bit line in the second bay, the third voltage is greater than the fourth voltage.

8. A method of operating non-volatile storage that includes a plurality of groups of reversible resistance-switching elements, at least one of the current or the power used by a group when programming a selected reversible resistance-switching element is a function of the location of the selected reversible resistance-switching element in the group, method comprising:
  receiving a unit of data to be stored in the non-volatile storage;
  mapping the unit of data to reversible resistance-switching elements in different ones of the groups based on the location of the reversible resistance-switching elements with the groups in order to minimize at least one of the worst case current or the worst case power consumption when programming the unit of data into reversible resistance-switching elements in different ones of the groups in parallel; and
  programming reversible resistance-switching elements in different ones of the groups in parallel based on the mapping.

9. The method as recited in claim 8, wherein the mapping the unit of data includes selecting a first reversible resistance-switching elements in a first block and selecting a second reversible resistance-switching elements in a second block, programming the first reversible resistance-switching elements consumes a relatively high amount of power by the first block, programming the second reversible resistance-switching elements consumes a relatively low amount of power by the second block.

10. The method as recited in claim 8, wherein the mapping the unit of data includes selecting a first reversible resistance-switching elements in a first block and selecting a second reversible resistance-switching elements in a second block, programming the first reversible resistance-switching elements consumes a relatively high amount of current by the first block, programming the second reversible resistance-switching elements consumes a relatively low amount of current by the second block.

11. The method as recited in claim 8, wherein each of the plurality of groups of reversible resistance-switching elements is associated with a plurality of bit line drivers, the mapping the unit of data to the reversible resistance-switching elements in order to minimize either the worst case current or power consumption includes selecting a first reversible resistance-switching element in a first of the blocks and a second reversible resistance-switching element in a second of the blocks, the first reversible resistance-switching element is relatively far from its bit line driver, the second reversible resistance-switching element is relatively close to its bit line driver.

12. The method as recited in claim 11, wherein each of the plurality of groups of reversible resistance-switching elements is further associated with a plurality of word line drivers, the mapping the unit of data to the reversible resistance-switching elements in order to minimize either the worst case current or power consumption further includes selecting the first reversible resistance-switching element in the first block and the second reversible resistance-switching element in the second block based on the first reversible resistance-switching element being relatively far from its word line driver and the second reversible resistance-switching element being relatively close to its word line driver.

13. The method as recited in claim 8, wherein each of the plurality of groups of reversible resistance-switching elements is associated with a plurality of word line drivers, the mapping the unit of data to the reversible resistance-switching elements in order to minimize either the worst case current or power consumption includes selecting a first reversible resistance-switching element in a first of the blocks and a second reversible resistance-switching element in a second of the blocks, the first reversible resistance-switching element is relatively far from its word line driver, the second reversible resistance-switching element is relatively close to its word line driver.

14. The method as recited in claim 8, wherein each of the plurality of groups of reversible resistance-switching elements is associated with a plurality of word lines and a plurality of bit lines, each reversible resistance-switching element is coupled to one of the word lines and one of the bit lines, the address of each reversible resistance-switching element is based on its position along its respective bit line and its respective word line, at least one of the current or the power required to program a given reversible resistance-switching element is based on its address.

* * * * *